(12) United States Patent
Mohanty

(10) Patent No.: US 9,383,208 B2
(45) Date of Patent: Jul. 5, 2016

(54) ELECTROMECHANICAL MAGNETOMETER AND APPLICATIONS THEREOF

(71) Applicant: Analog Devices, Inc., Norwood, MA (US)

(72) Inventor: Pritiraj Mohanty, Los Angeles, CA (US)

(73) Assignee: Analog Devices, Inc., Norwood, MA (US)

(*) Notice: Subject to any disclaimer, the term of this patent is extended or adjusted under 35 U.S.C. 154(b) by 532 days.

(21) Appl. No.: 13/650,442

(22) Filed: Oct. 12, 2012

(65) Prior Publication Data

US 2013/0096825 A1   Apr. 18, 2013

Related U.S. Application Data

(60) Provisional application No. 61/546,858, filed on Oct. 13, 2011.

(51) Int. Cl.
*G04C 3/10* (2006.01)
*G01C 21/16* (2006.01)
(Continued)

(52) U.S. Cl.
CPC ............ *G01C 21/165* (2013.01); *G01P 15/097* (2013.01); *G01R 33/0286* (2013.01);
(Continued)

(58) Field of Classification Search
CPC ....... G01P 3/488; G01P 17/28; G01P 15/097; G01N 29/2412; G01N 29/30; G01N 33/02; G01R 33/07; G01R 33/072; G01R 33/20; G01R 33/26; G01R 33/0286; G01V 7/005; H01J 37/147; H01J 37/243; H01J 37/3171; H01S 1/06; H03B 5/30; G01C 21/165; G01C 17/28

USPC ............... 324/207.15, 300, 318, 228; 33/365; 331/116 M, 116 R, 116 FE, 154; 73/504, 73/12, 504.12; 600/409
See application file for complete search history.

(56) References Cited

U.S. PATENT DOCUMENTS

4,278,492 A   7/1981   Cross
4,364,016 A   12/1982  Tanski
(Continued)

FOREIGN PATENT DOCUMENTS

EP   0375360   6/1990
EP   0707212   4/1996
(Continued)

OTHER PUBLICATIONS

Di Pietrantonio, "Guided Lamb Wave Electroacoustic Devices on Micromachined AlN/Al Plates", IEEE Transactions on Ultrasonics, Ferroelectrics, and Frequency Control, pp. 1175-1182, vol. 57, No. 5, May 2010.

(Continued)

*Primary Examiner* — Arnold Kinkead
(74) *Attorney, Agent, or Firm* — Wolf, Greenfield & Sacks, P.C.

(57) ABSTRACT

A system that incorporates the subject disclosure may include, for example, a method for producing an electrical signal from an apparatus comprising an induction coil coupled to a mechanical resonator, wherein the electrical signal has an operating frequency proportional to a mechanical resonating frequency of the mechanical resonator and proportional to a change in a magnetic flux resulting from a change in orientation in the apparatus, detecting with a detection circuit a change in the electrical signal resulting from a change in the magnetic flux caused by the change in orientation in the apparatus, and determining a direction of the apparatus according to the change in the electrical signal. Other embodiments are disclosed.

24 Claims, 28 Drawing Sheets

(51) Int. Cl.
  *H03B 5/30* (2006.01)
  *G01R 33/028* (2006.01)
  *G01P 15/097* (2006.01)
  *H01J 37/24* (2006.01)
  *H01J 37/147* (2006.01)
  *G01R 33/07* (2006.01)
  *G01C 17/28* (2006.01)

(52) U.S. Cl.
  CPC .................. *H03B 5/30* (2013.01); *G01C 17/28* (2013.01); *G01R 33/072* (2013.01); *H01J 37/147* (2013.01); *H01J 37/243* (2013.01)

(56) References Cited

U.S. PATENT DOCUMENTS

| | | | |
|---|---|---|---|
| 4,442,574 | A | 4/1984 | Wanuga |
| 4,454,639 | A | 6/1984 | Dworsky |
| 4,631,197 | A | 12/1986 | Defreese |
| 5,416,447 | A | 5/1995 | Andres |
| 5,824,903 | A | 10/1998 | Nakamura et al. |
| 5,914,553 | A | 6/1999 | Adams |
| 5,939,956 | A | 8/1999 | Arimura |
| 6,121,856 | A | 9/2000 | Apostolos |
| 6,124,765 | A | 9/2000 | Chan |
| 6,420,820 | B1 | 7/2002 | Larson |
| 6,577,040 | B2 | 6/2003 | Nguyen |
| 6,739,190 | B2 | 5/2004 | Hsu |
| 6,828,713 | B2 | 12/2004 | Bradley |
| 6,831,531 | B1 | 12/2004 | Giousouf |
| 6,859,113 | B2 | 2/2005 | Giousouf |
| 6,909,221 | B2 | 6/2005 | Ayazi |
| 6,943,484 | B2 | 9/2005 | Clark |
| 6,954,020 | B2 | 10/2005 | Ma |
| 6,975,184 | B2 | 12/2005 | Wang |
| 6,987,432 | B2 | 1/2006 | Lutz |
| 6,995,622 | B2 | 2/2006 | Partridge |
| 7,005,946 | B2 | 2/2006 | Duwel |
| 7,068,125 | B2 | 6/2006 | Lutz |
| 7,102,467 | B2 | 9/2006 | Lutz |
| 7,170,369 | B2 | 1/2007 | Huang |
| 7,211,926 | B2 | 5/2007 | Quevy |
| 7,215,061 | B2 | 5/2007 | Kihara |
| 7,248,128 | B2 | 7/2007 | Mattila |
| 7,310,029 | B2 | 12/2007 | Robert |
| 7,327,070 | B2 | 2/2008 | Tanaka |
| 7,352,608 | B2 | 4/2008 | Mohanty |
| 7,492,241 | B2 | 2/2009 | Piazza |
| 7,504,909 | B2 | 3/2009 | Tada |
| 7,528,685 | B2 | 5/2009 | Tanaka |
| 7,535,152 | B2 | 5/2009 | Ogami |
| 7,561,009 | B2 | 7/2009 | Larson |
| 7,724,103 | B2 | 5/2010 | Feng |
| 7,791,432 | B2 | 9/2010 | Piazza |
| 7,868,517 | B2 | 1/2011 | Belot |
| 7,965,015 | B2 | 6/2011 | Tai |
| 8,058,769 | B2 | 11/2011 | Kuypers et al. |
| 8,362,675 | B2 | 1/2013 | Chen et al. |
| 8,629,599 | B2 | 1/2014 | Chen et al. |
| 8,686,614 | B2 | 4/2014 | Gaidarzhy et al. |
| 8,704,604 | B2 | 4/2014 | Schoepf et al. |
| 8,937,425 | B2 | 1/2015 | Chen et al. |
| 2002/0075100 | A1 | 6/2002 | Katohno |
| 2002/0158700 | A1 | 10/2002 | Nemoto |
| 2003/0034852 | A1 | 2/2003 | Kobayashi |
| 2003/0146674 | A1 | 8/2003 | Jacob |
| 2004/0056728 | A1 | 3/2004 | Dent |
| 2004/0239450 | A1 | 12/2004 | Wang |
| 2005/0073078 | A1 | 4/2005 | Lutz |
| 2005/0110598 | A1 | 5/2005 | Larson |
| 2007/0188047 | A1 | 8/2007 | Tanaka |
| 2007/0222336 | A1 | 9/2007 | Grannen |
| 2007/0236213 | A1* | 10/2007 | Paden et al. .............. 324/228 |
| 2008/0048804 | A1 | 2/2008 | Volatier |
| 2008/0143217 | A1 | 6/2008 | Ho |
| 2008/0204153 | A1 | 8/2008 | Yoshida |
| 2008/0272852 | A1 | 11/2008 | Six |
| 2008/0284286 | A1 | 11/2008 | Ogawa |
| 2008/0297281 | A1 | 12/2008 | Ayazi |
| 2009/0026882 | A1 | 1/2009 | Steeneken |
| 2009/0108381 | A1 | 4/2009 | Buchwalter |
| 2009/0108959 | A1 | 4/2009 | Piazza |
| 2009/0144963 | A1 | 6/2009 | Piazza |
| 2009/0243747 | A1 | 10/2009 | Gaidarzhy |
| 2009/0255338 | A1 | 10/2009 | Watanabe |
| 2009/0294638 | A1 | 12/2009 | Mohanty |
| 2010/0007443 | A1 | 1/2010 | Mohanty |
| 2010/0026136 | A1 | 2/2010 | Gaidarzhy |
| 2010/0038991 | A1 | 2/2010 | Shih |
| 2010/0134207 | A1 | 6/2010 | Mohanty |
| 2010/0155883 | A1 | 6/2010 | Wenzler |
| 2010/0181868 | A1 | 7/2010 | Gaidarzhy |
| 2010/0182102 | A1 | 7/2010 | Kuypers |
| 2010/0237959 | A1 | 9/2010 | Tanaka |
| 2012/0098527 | A1* | 4/2012 | Ely .......................... G01D 5/208 324/207.15 |
| 2015/0091412 | A1 | 4/2015 | Chen et al. |

FOREIGN PATENT DOCUMENTS

| | | |
|---|---|---|
| EP | 0706053 | 10/1996 |
| EP | 0791832 | 8/1997 |
| EP | 1505722 | 2/2005 |
| WO | WO98/01948 | 1/1998 |
| WO | WO98/37635 | 8/1998 |
| WO | WO02/17481 | 2/2002 |
| WO | WO2006/000611 | 1/2006 |
| WO | WO2006/083492 | 8/2006 |
| WO | WO2006/130777 | 12/2006 |
| WO | WO2007/072408 | 6/2007 |
| WO | WO2007/072409 | 6/2007 |
| WO | WO2007/143520 | 12/2007 |
| WO | WO2010/011288 | 1/2010 |

OTHER PUBLICATIONS

Driscoll, M.M, "Voltage-Controlled Crystal Oscillators", IEEE Transactions on Electron Devices, Aug. 1971, vol. 18 (8), pp. 528-535.

Driscoll, M.M., "Linear Frequency Tuning of SAW Resonators", Trans. Ultrason. Ferroelectr. Freq. Control. IEEE 1991, Westinghouse Electr. Corp., Baltimore, MD, 38(4):366-9.

Humad, "High Frequency Micromechanical Piezo-On Silicon Block Resonators", Int'l Electron Devices Meeting 2003 IEDM, Technical Digest, Washington, D.C. Dec. 8-10, 2003, New York, NY IEEE US Dec. 8, 2003, pp. 957-960.

Kadota, "High-Frequency Lamb Wave Device Composed of MEMS Structure Using LINBO3 Thin Film and Air Gap", IEEE Transactions on Ultrasonics, Ferroelectrics, and Frequency Control, pp. 2564-2571, vol. 57, No. 11, Nov. 2010.

Onoe, "Several Extensions of Mindlin-Gazis's Analysis of Rotated Y-Cut of Quartz (Invited)", 2008 IEEE, pp. 10-18.

Parker, "Precision Surface-Acoustic-Wave (SAW) Oscillators", IEEE Transactions on Ultrasonics, Ferroelectrics, and Frequency Control, pp. 342-364, vol. 35 No. 3, May 1988.

Patent Cooperation Treaty, "International Preliminary Report on Patentability and Written Opinion", for International Application No. PCT/US06/021298 mailed Nov. 6, 2006 and Dec. 6, 2007 respectively.

Patent Cooperation Treaty, "International Search Report and Written Opinion", for International Application No. PCT/US09/06587 mailed Feb. 26, 2010.

Patent Cooperation Treaty, "International Search Report and Written Opinion", for International Application No. PCT/US09/06590 mailed Mar. 1, 2010.

Patent Cooperation Treaty, "International Search Report and Written Opinion", for International Application No. PCT/US10/000301 mailed Sep. 3, 2010.

Piazza, "Low Motional Resistance Ring-Shaped Contour-Mode Aluminum Nitride Piezoelectric Micromechanical Resonators for UHF Applications", Micro Electro Mechanical Systems, 2005. MEMS

(56) References Cited

OTHER PUBLICATIONS 2005. 18th IEEE International Conference on Miami Beach, Florida, Jan. 30-Feb. 3, 2005, Piscataway, NJ, US, IEEE Jan. 30, 2005, pp. 20-30.

Reinhardt, "Simulation FO Baw Resonators Frequency Adjustment", 2007 Ultrasonics Symposium, pp. 1444-1447.

Tirole, "Lamb Waves Pressure Sensor Using an A AℓN/SIN/SI Structure", 1993 Ultrasonics Symposium, pp. 371-374.

Uno, "Frequency Trimming of Saw Devices", IEEE, Ultrasonics Symposium, 1994, pp. 181-187.

Wang, "In-Situ Frequency Trimming of Saw Resonator Using Conventional Crystal Resonator Fine Tuning Method With Gold Thin Film Addition", 2003 IEEE Ultrasonics Symposium, pp. 1730-1733.

Wang, "Method of Fabricating Multiple-Frequency Film Bulk Acoustic Resonators in a Single Chip", 2006 IEEE, pp. 793-796.

Wang, "The Analysis of the Third-Order Thickness-Shear Overtone Vibrations of Quartz Cristal Plates With Mindlin Plate Theory", 2008 IEEE International Ultrasonics Symposium Proceedings, pp. 2173-2176.

Wingqvist, "A Micromachined Thermally Compensated Thin Film Lamb Wave Resonator for Frequecy Control and Sensing Applications", IOP Publishing Ltd., Journal of Micromechanics and Microengineering 19 (2009) 035018, pp. 1-9.

Yatsuda, "Flip-Chip STW Filters and Frequency Trimming Method", 2002 IEEE International Frequency Control Symposium and PDA Exhibition, pp. 366-369.

\* cited by examiner

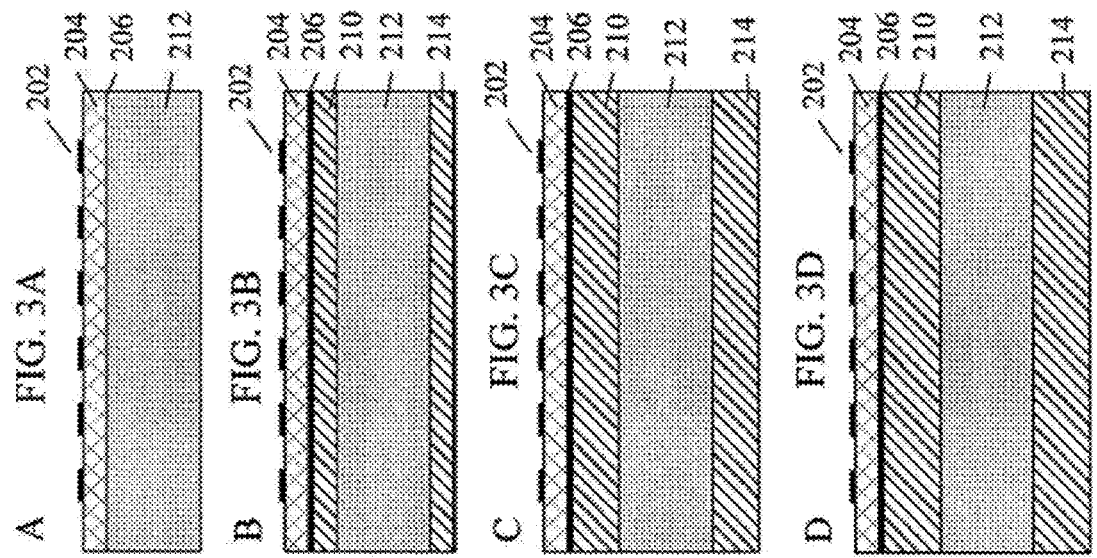

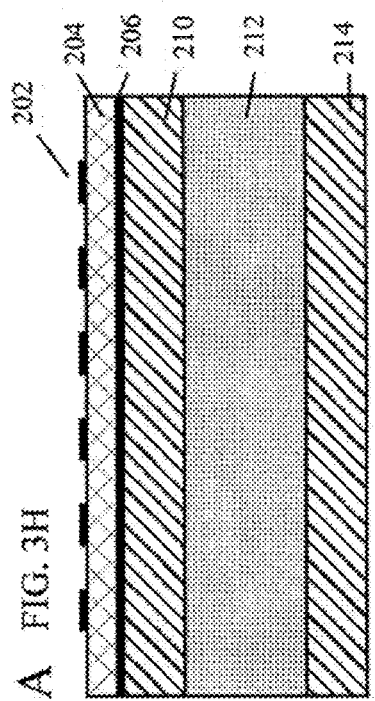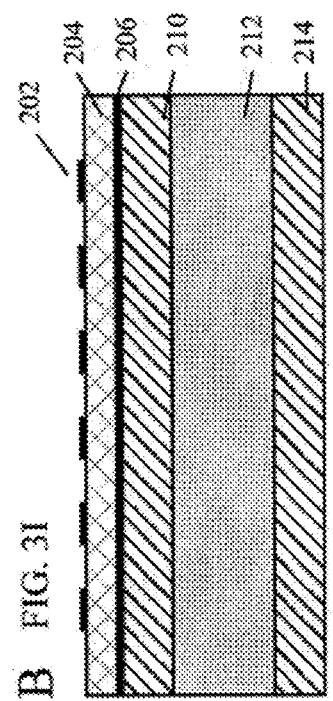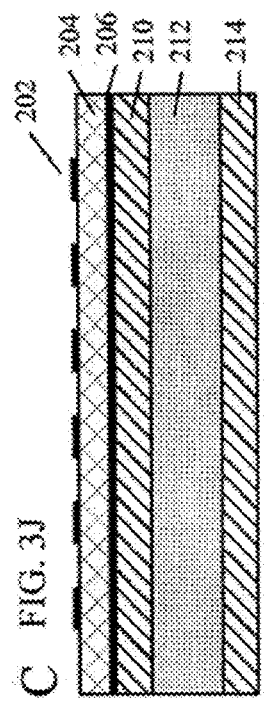

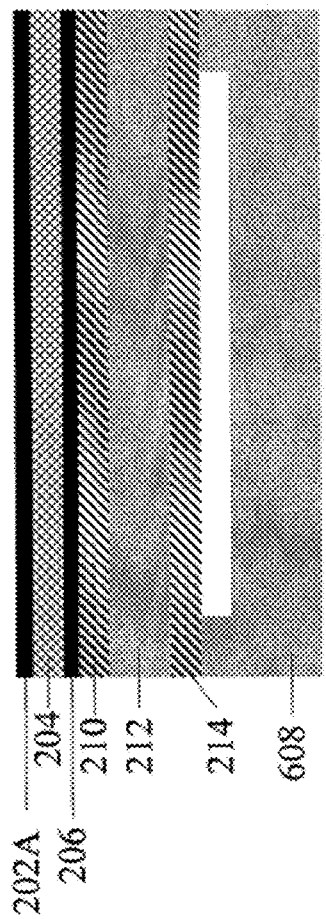
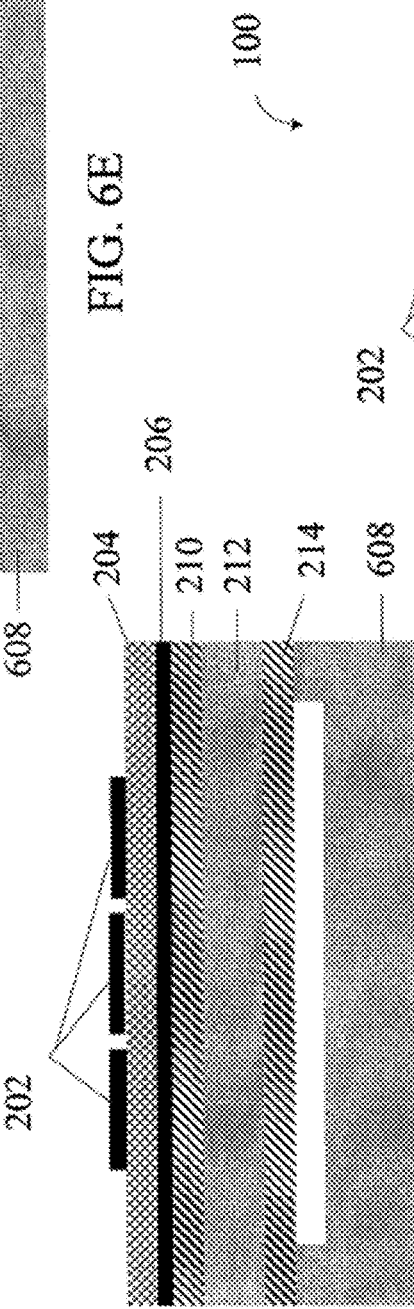
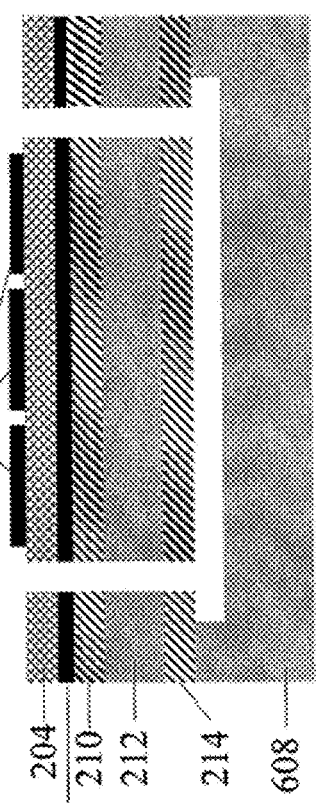
FIG. 6E
FIG. 6F
FIG. 6G

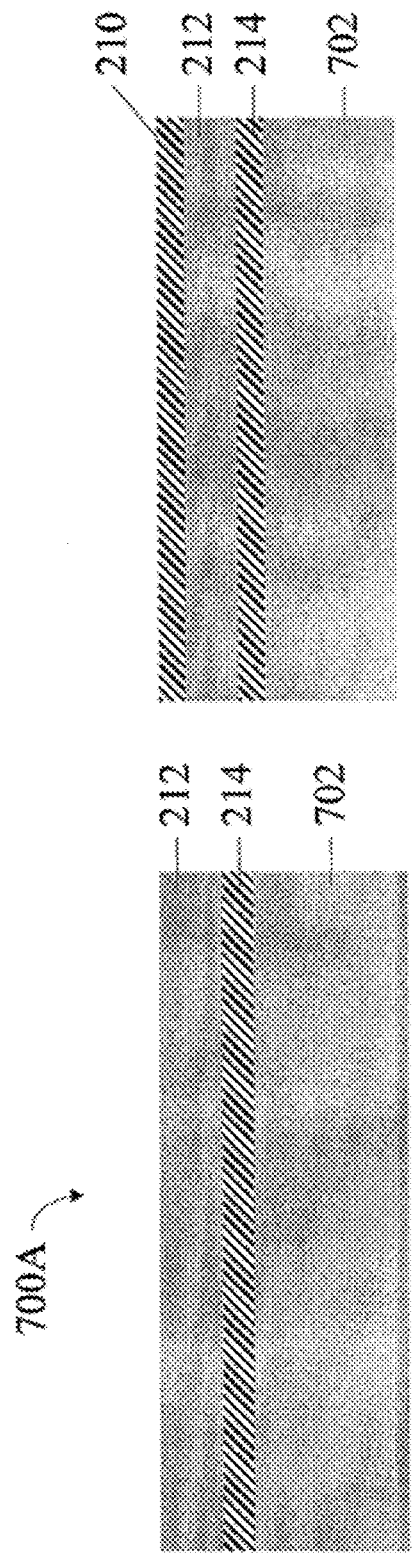
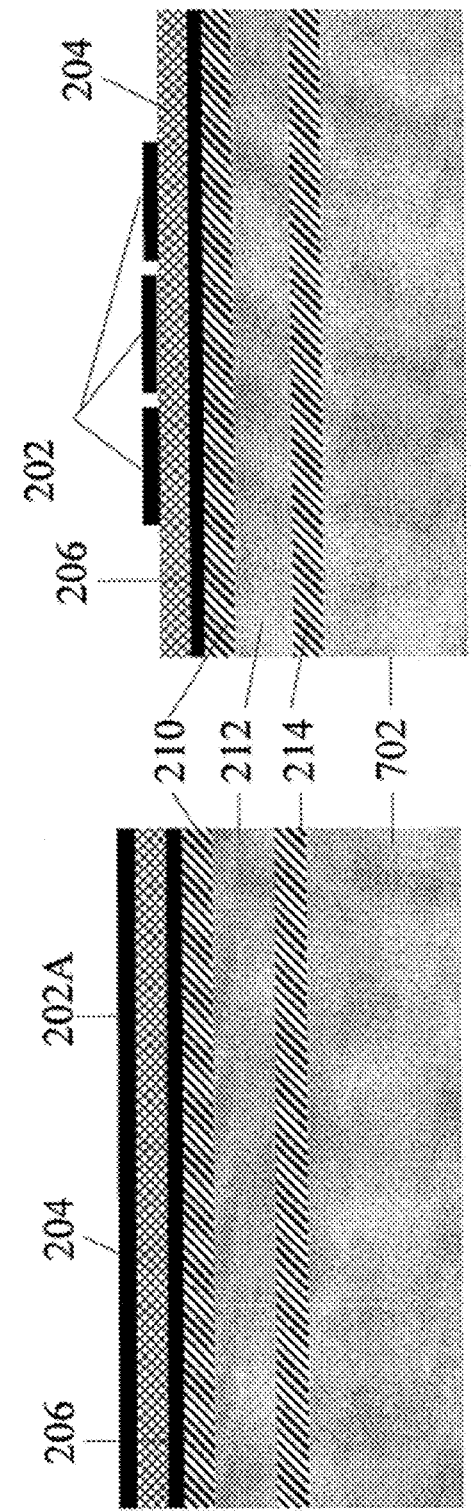
FIG. 7A
FIG. 7B
FIG. 7C
FIG. 7D

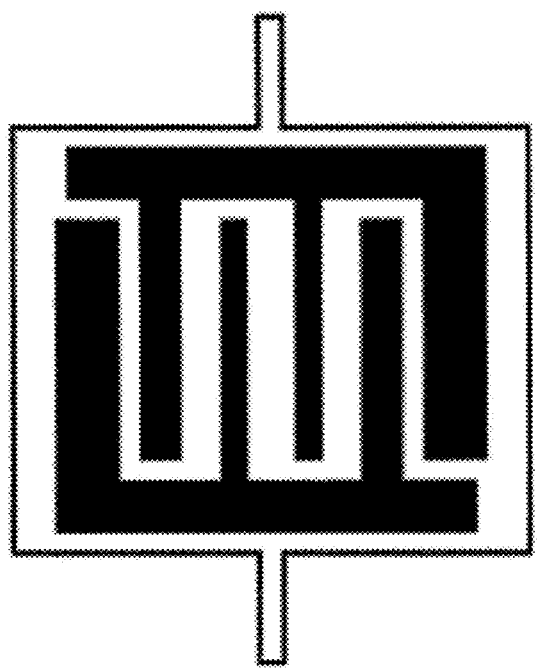
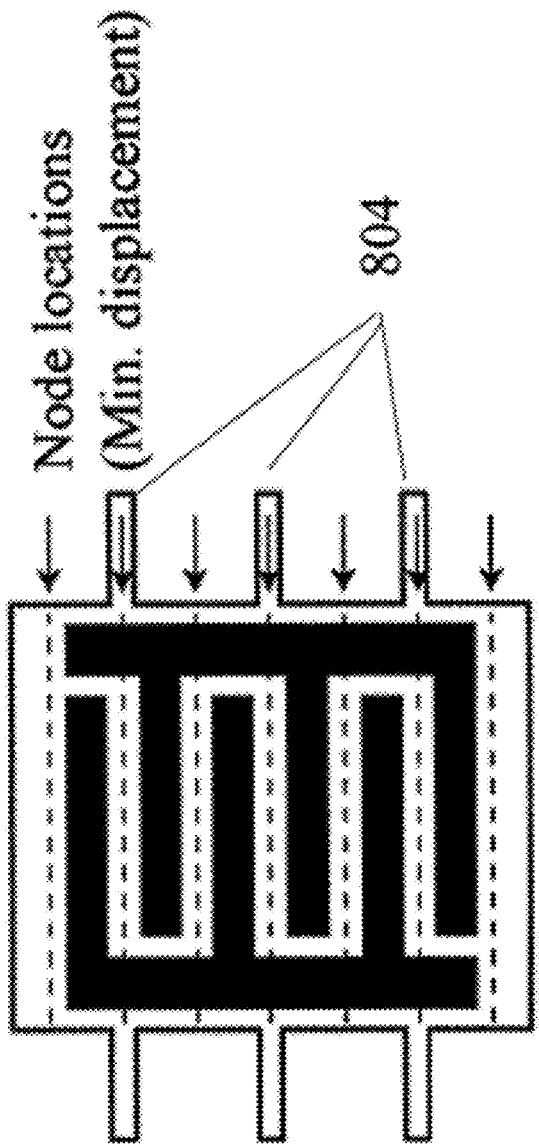
FIG. 8A
FIG. 8B

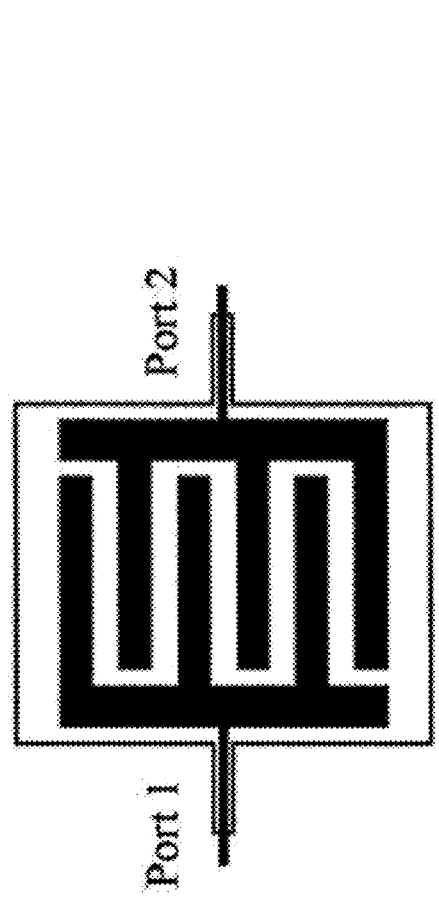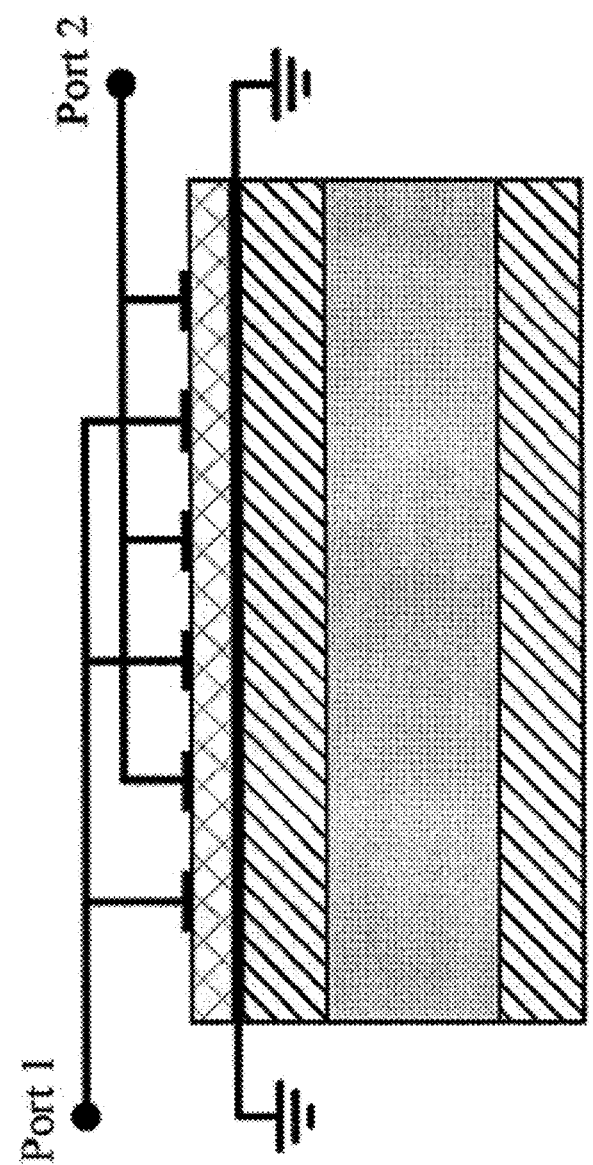
FIG. 9A
FIG. 9B

Side view of the S0 displacement

Side view of the A0 displacement

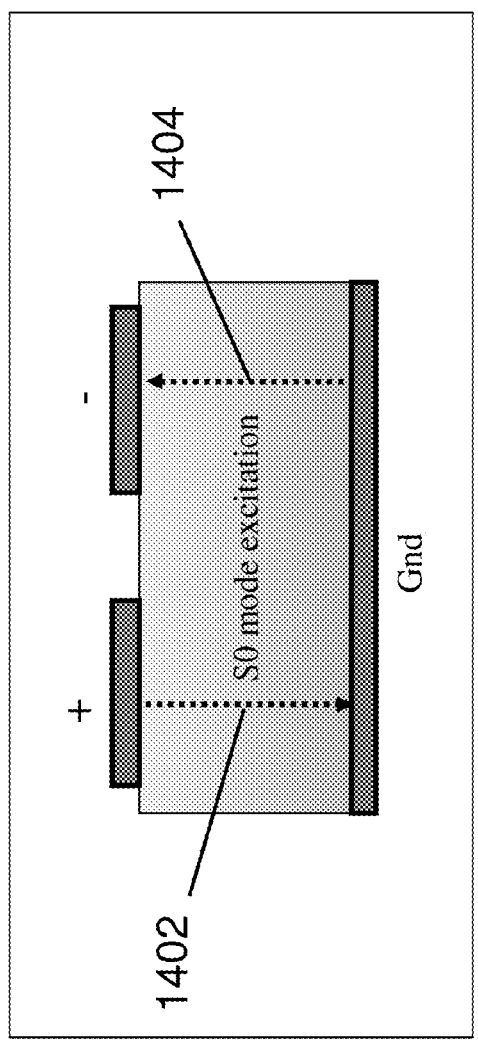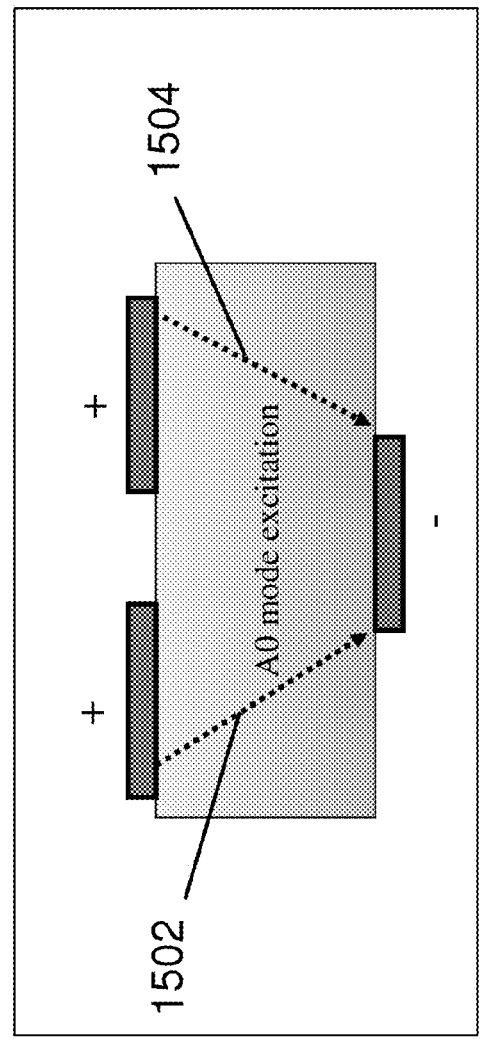

1800

| | Range | Sensitivity | Field Rob. | Cost, Size, Manufacturability | Power Cons. | Bandwidth | Limitations |
|---|---|---|---|---|---|---|---|
| SQUID | fT-nT | < 1 fT/rtHz | No | High, Large, Yes | High | >100 MHz | Low Temp |
| Search Coil | fT-mT | 1 fT/rtHz | Yes | High, Large, Yes | Low | Hz-MHz | Large |
| Fluxgate | nT-mT | 10 pT/rtHz | Yes | High, Large, Yes | Medium | DC-kHz | Sensitivity |
| Hall Effect | nT-mT | 100nT/rtHz | Yes | Low, Low, Yes | Medium | DC-MHz | Sensitivity |
| Nuclear Prec. | nT-mT | 100 pT/rtHz | No | High, Large, No | High | Hz-MHz | Large |
| GMR/AMR | nT-mT | 100 pT/rtHz | Yes | Low, low, Yes | Low | Hz-GHz | Sensitivity |
| Fiber Optic | pT-mT | 1 pT/rtHz | No ? | High, Large, No | High | DC-60kHz | Bandwidth |
| Maneto-Optical | nT-mT | 30 pT/rtHz | No ? | High, Large, No | High | <1GHz | Large |
| MEMS (tunnel) | nT-mT | 1 nT/rtHz | Yes | Low, low, yes | Low | <1GHz | Sensitivity |
| MEMS(Lorenz) | uT-mT | 100 nT/rtHz | Yes | Low, low, yes | Low | <1GHz | Sensitivity |
| Optically pumped | pT-uT | 1 pT/rtHz | No | High, Large, No | High | MHz | Large |
| HYMRIM | nT-mT | 100 pT/rtHz | Yes | Low, low, yes | Low | kHz - GHz | |

FIG. 21

Designs of Different HYMRIM Magnetometers

| Geometry | Dimensions [μm] | Typical Resonance Characs. | Minimum detectable Magnetic Field (for assuming minimum signal size of 10 nV) |
|---|---|---|---|
| 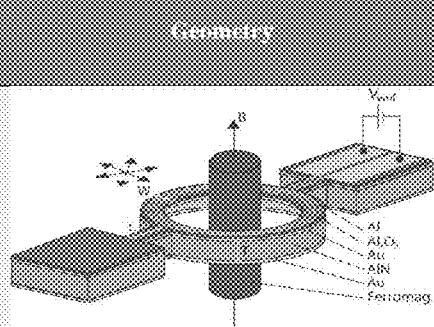 | $L^a = 25$<br>$W^b = 50$<br>$T^c = 10$<br>$C^d \approx 600$ | $Q^e \approx 10{,}000$<br>$f_o{}^f \approx 1000$ MHz<br>$z^g \approx 5$ pm | $A^h = n^i Cz \approx 3 \times 10^{-14}$ m$^2$<br>$B_{MIN} \approx 3 \times 10^{-6}$ T |
| 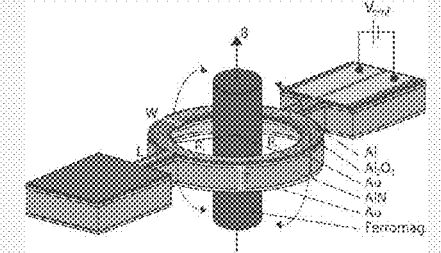 | $L = 25$<br>$W = 50$<br>$T = 10$<br>$R_o{}^j = 100$<br>$R_i{}^k = 50$<br>$C \approx 600$ | $Q \approx 5{,}000$<br>$f_o \approx 100$ MHz<br>$z \approx 30$ nm | $A \approx 0.5 n Cz \approx 3 \times 10^{-11}$ m$^2$<br>$B_{MIN} \approx 40 \times 10^{-9}$ T |

[a] length, [b] width, [c] thickness of the Aluminum Nitride, [d] average circumference, [e] quality factor at 300 K and atmospheric pressure, [f] resonant frequency of the geometry [g] maximum displacement of the resonator, [h] change in area covered by the resonating coil, [i] number of turns of the coil (here assumed to be 10), [j] outer radius of the ring, [k] inner radius of the ring, [l] distance between beams.

FIG. 22

| Parameter | Objective | Objective Low | Objective High |
|---|---|---|---|
| Q | 3000 | 10000 | 10000 |
| Number of coil turns | 1 | 3 | 10 |
| Apparent permeability | 1 | 6 | 30 |
| Number devices in array | 1 | 100 | 1000 |
| Size, micron | 100 | 30 | 30 |
| Coil resistance, Ohm | 50 | 50 | 150 |
| Device noise, nV/rtHz | 1 | 1 | 1.6 |
| Total performance gain, dB | | 50-60 | ~90 |
| Expected noise | 1 nT/rtHz | pT/rtHz | 30 fT/rtHz |

ELECTROMECHANICAL MAGNETOMETER AND APPLICATIONS THEREOF

PRIOR APPLICATION

The present application claims the benefit of priority to U.S. Provisional Application No. 61/546,858 filed on Oct. 13, 2011, which is hereby incorporated herein by reference in its entirety.

RELATED APPLICATIONS

U.S. patent application Ser. No. 13/186,428, filed Jul. 19, 2011, by Florian Thalmayr et al., entitled "METHOD AND APPARATUS FOR MANUFACTURING A RESONATING STRUCTURE."

U.S. patent application Ser. No. 13/234,352, filed Sep. 16, 2011, by Zolfagharkhani et al., entitled "RESONANT SENSING USING EXTENSIONAL MODES OF A PLATE."

All sections of the aforementioned applications are incorporated herein by reference.

BACKGROUND

Mechanical resonators are physical structures that are designed to vibrate at high frequencies. Such resonators may be incorporated into a variety of devices such as timing oscillators, mass sensors, gyros, accelerometers, switches, and electromagnetic fuel sensors, amongst others.

During use, mechanical resonators, and the devices which incorporate the same, may be exposed to different temperature conditions and variations. Such conditions and variations can cause material expansion and contraction, as well as changes in material stiffness. This can result in a variation in vibrational characteristics (e.g., resonating frequency) across the temperature range. These effects also can lead to increased noise, reduction in bandwidth, deterioration of signal quality and can, in general, create stability problems in devices.

The temperature stability of a mechanical resonator may be quantified as the temperature coefficient of frequency (TCF), which is expressed as: $TCF = (1/f)(\partial f/\partial T)$, where f is the resonance frequency and T is the temperature. Another term that is used to quantify the stiffness component of the temperature stability of a mechanical resonator (which is one of the primary contributors to TCF) is the temperature coefficient of stiffness (TCS), which can be expressed as: $TCS = (1/C_{eff})(\partial C_{eff}/\partial T)$, where $C_{eff}$ is the effective stiffness coefficient of the resonator.

To address the effects resulting from temperature change, it can be advantageous for mechanical resonating structures to have temperature compensation capabilities to improve the stability of such structures, and associated devices, over a range of temperatures.

Mechanical resonating structures can be used in a variety of circuit components. A mechanical resonating structure can be used, for example, in tunable meters, mass sensors, gyros, accelerometers, switches, magnetometers, electromagnetic fuel sensors, timing oscillators, filters, mixers, dividers, and amplifiers, just to mention a few.

BRIEF DESCRIPTION OF THE DRAWINGS

FIG. 3A shows a diagram of an uncompensated mechanical resonating structure with a negatively-sloped temperature coefficient of frequency.

FIG. 3B shows a diagram of a mechanical resonating structure with a negatively-sloped temperature coefficient of frequency according to embodiments of the present disclosure.

FIG. 3C shows a diagram of a mechanical resonating structure with an approximately zero temperature coefficient of frequency according to embodiments of the present disclosure.

FIG. 3D shows a diagram of a mechanical resonating structure with a positively-sloped temperature coefficient of frequency according to embodiments of the present disclosure.

FIG. 3E shows a graph of the normalized frequency variation ($\Delta f/f$) versus temperature of the mechanical resonating structures in FIGS. 3A-3D as a function of temperature according to embodiments of the present disclosure.

FIGS. 3H-3J show diagrams of mechanical resonating structures with different layer thicknesses having a zero temperature coefficient of frequency at room temperature and varying non-linear temperature coefficients of frequency according to embodiments of the present disclosure.

FIGS. 6A-6G illustrate steps for fabricating a mechanical resonating structure using a first method according to embodiments of the present disclosure.

FIGS. 7A-7F illustrate steps for fabricating a mechanical resonating structure using a second method according to embodiments of the present disclosure.

FIGS. 8A-8B show configurations of a mechanical resonating structure that suppresses spurious frequencies according to embodiments of the present disclosure.

FIGS. 9A-9B illustrate a two-port mechanical resonating structure according to embodiments of the present disclosure.

FIGS. 14-15 depict excitation mechanisms for controlling modes of operation of a mechanical resonating structure.

FIG. 21 depicts an illustrative embodiment of a comparison of multiple technologies based on achievable sensitivity, robustness, cost, manufacturability, and inherent limitations.

FIG 22 depicts an illustrative embodiment of breathing mode and tensional mode resonators with ferromagnetic cores to measure magnetic fields. The adjacent columns include typical device parameters, dynamic response and resulting sensitivity. The piezoelectric drive circuit is not included in these figures. The final design may have a very different physical look even though it retains most of the design features, described here. Also shown are sensitivity plots for varying frequency, Quality factor, Amplitude and resonator length. For all parameters the electrical Johnson noise provides the sensitivity noise floor of the device.

FIG. 23 depicts an illustrative embodiment of a sensor design and performance.

Figure 1:
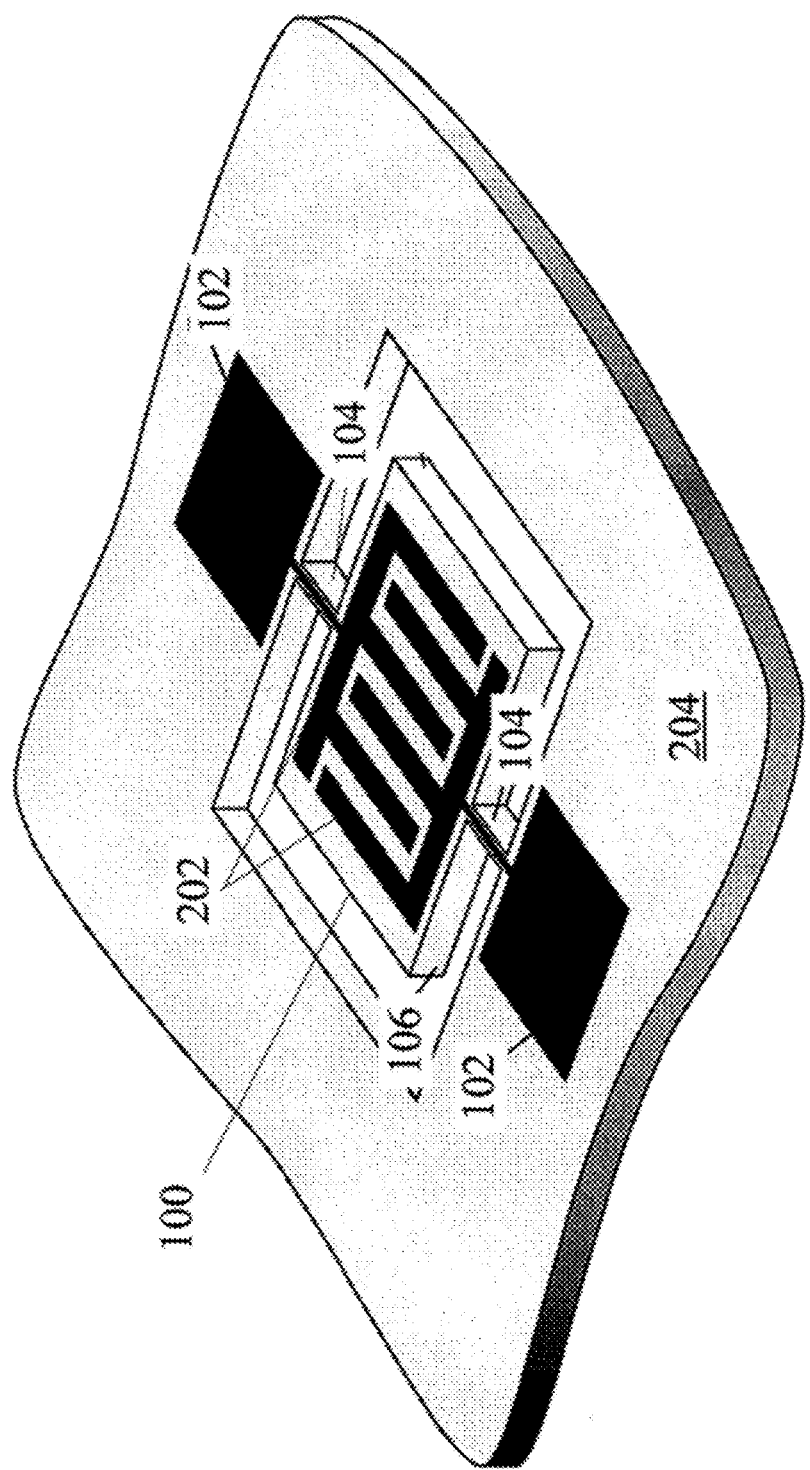
FIG. 1 shows a 3-D top view of a mechanical resonating structure according to embodiments of the present disclosure.

In the drawings, the same reference numbers identify identical or substantially similar elements or acts. The drawings illustrate particular embodiments for the purpose of describing the present disclosure, and are not intended to be exclusive or limiting in any way. The figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the present disclosure shown where illustration is not necessary to allow those of ordinary skill in the art to understand the disclosure.

In the course of the detailed description to follow, reference will be made to the attached drawings. These drawings show different aspects of the present disclosure and, where appropriate, reference numerals illustrating like structures, components, materials and/or elements in different figures are labeled similarly. It should be understood that various combinations of the structures, components, materials and/or elements, other than those specifically shown, are contemplated and are within the scope of the present disclosure.

DETAILED DESCRIPTION

Mechanical resonating structures, as well as related devices and methods, are described herein.

In one embodiment of the present disclosure, a device can have a mechanical resonating structure that includes an active layer and a compensating structure coupled to the active layer. The compensating structure can have a first layer having a stiffness that increases with increasing temperature over at least a first temperature range, a third layer having a stiffness that increases with increasing temperature over at least the first temperature range, and a second layer between the first layer and the third layer.

In another embodiment of the present disclosure, a device can have a mechanical resonating structure that includes an active layer and a compensation structure coupled to the active layer and configured to compensate temperature-induced variations in stiffness of at least the active layer. The compensation structure can have a first layer, a second layer, and a third layer. The first and third layers can be formed of a first material and the second layer can be formed of a second material different than the first material. The second layer can be disposed between the first layer and the second layer.

In one embodiment of the present disclosure, a method is provided for constructing a mechanical resonating structure by forming an active layer on a surface of a compensating structure. The compensating structure can have one or more materials having an adaptive stiffness that reduces a variance in a resonating frequency of the mechanical resonating structure as a function of temperature. The method can further include adjusting an operational profile of the mechanical resonating structure by adding one or more materials to at least a first portion of the mechanical resonating structure, removing one or more materials from at least a second portion of the mechanical resonating structure, or combinations thereof.

In one embodiment of the present disclosure, a method is provided for obtaining a mechanical resonating structure having an active layer on a surface of a compensating structure comprising one or more materials, and adjusting an operational profile of the mechanical resonating structure by adjusting a thickness of at least one of the active layer and the one or more materials of the compensating structure, wherein the one or more materials of the compensating structure have an adaptive firmness that reduces a variance in a resonating frequency of the mechanical resonating structure as a function of temperature.

In one embodiment of the present disclosure, a mechanical resonator can have an active layer, a compensating structure coupled to the active layer, and an adjustment layer coupled to one of the active layer and the compensating structure. The compensating structure can have one or more materials having a resistance to deform in response to an applied force thereby reducing a variance in a resonating frequency of the mechanical resonating structure as a function of temperature. The mechanical resonating structure can have a desired operational profile as a result of a removal of one or more materials from at least one of the active layer, the adjustment layer, and compensating structure.

Other embodiments and features of the present disclosure will become apparent from the following detailed description of the disclosure when considered in conjunction with the accompanying drawings. All patent applications and patents incorporated herein by reference are incorporated by reference in their entirety. In case of conflict, the present specification, including definitions, will control.

Mechanical resonating structures, as well as related devices and methods, are described herein. The mechanical resonating structures include an active layer comprising an active material (e.g., a piezoelectric material). For example, the active layer may be formed of a piezoelectric material. The stiffness of the active layer generally varies across the range of temperature to which the mechanical resonating structures are exposed during use. As described further below, the mechanical resonating structures include a compensating structure that can be designed to have a stiffness variation with temperature such that it balances the stiffness variation with temperature of the active layer and/or any additional layers of the mechanical resonating structure (e.g., electrode layers, support layers, or any other layers of the mechanical resonating structure) to give the mechanical resonating structure a targeted stiffness variation over the temperature range.

According to one aspect, the compensating structure can be designed such that the mechanical resonating structure has a desired frequency variation with temperature, for example by compensating for any one or more (including all) of the following: temperature-induced variations in stiffness of the materials of the mechanical resonating structure; temperature-induced expansion and/or contraction of materials; stresses caused by different coefficients of thermal expansion of different materials of the mechanical resonating structure; interfacial stresses arising from interfaces between materials of the mechanical resonating structure; stresses generated by a substrate and/or anchors connected to the mechanical resonating structure (in those embodiments in which the mechanical resonating structure is coupled to a substrate by anchors); and stresses arising from packaging of the mechanical resonating structure. For example, the compensating structure can be designed so that the resonant frequency of the mechanical resonating structure does not vary much, or at all, over a wide temperature range (e.g., TCF approaches, or is equal to 0). The compensation, thus, can significantly reduce undesirable effects that would result from such variation including a deterioration in signal quality and stability, amongst others.

FIG. 1 shows a mechanical resonating structure 100 according to an embodiment. The mechanical resonating structure is connected to pads 102 via anchors 104 according to this embodiment. As described further below, the mechanical resonating structure vibrates in response to a source of excitation (e.g., application of an electrical potential), and in some embodiments is configured (shaped, sized, etc.) to support one or more modes of Lamb waves. The mechanical vibration of the mechanical resonating structure may be converted to an electrical output signal which, for example, may be further processed. The mechanical resonating structure can generate signals with multiple modes and resonant frequencies, and, as mentioned, in some embodiments may be configured to support one or more modes of Lamb waves, although not all embodiments are limited in this respect. Typically, one of the modes can dominate and the mechanical resonating structure can vibrate at the resonant frequency associated with the dominant mode. The mechanical resonating structure can include a resonating structure plate 106 and interdigital transducer (IDT) electrodes 202. The mechanical resonating structure can include an active layer 204, as described further below.

The frequency produced by the mechanical resonating structure may vary depending on the design and application. For example, the frequency produced may be between a 1 kHz and 10 GHz. In some embodiments, for example, the frequencies are in the upper MHz range (e.g., greater than 100 MHz), or at least 1 GHz (e.g., between 1 GHz and 10 GHz). In some cases, the signal may have a frequency of at least 1 MHz (e.g., 13 MHz, 26 MHz) or, in some cases, at least 32 kHz.

The dimensions of the mechanical resonating structure depend, in part, on the desired performance including the desired frequency. According to some embodiments, the mechanical resonating structure can be a micromechanical resonator. The mechanical resonating structure may have a "large dimension" (i.e., the largest of the length, width, thickness, etc.) of less than 1 mm; in some cases, the large dimension is less than 500 micron, or less than 100 micron, or less than 10 micron.

The mechanical resonating structure may have any suitable shape. For example, the configuration of the mechanical resonating structure can include, for example, any antenna type geometry, as well as beams, cantilevers, free-free bridges, free-clamped bridges, clamped-clamped bridges, discs, rings, prisms, cylinders, tubes, spheres, shells, springs, polygons, diaphragms and tori. Any of the mechanical resonating structure elements may be formed either in whole or in part of the same or different geometries. In addition, several different type geometrical structures may be coupled together to obtain particular resonance mode responses, as described further below. For example, FIG. 8A shows a mechanical resonating structure design with an IDT electrode configuration that allows reduction in coupling of spurious frequencies and their associated modes. In another example illustrated in FIG. 8B, additional anchors 804 may be added to support a mechanical resonating structure. The anchors can be placed at locations of minimum displacement (of the mechanical resonating structure), so that spurious resonator modes can be suppressed. Similarly, geometrical and structural alterations can be made to improve quality (e.g., Q-factor, noise) of the signal generated by the mechanical resonating structure.

In some embodiments, the mechanical resonating structure may include a plurality of resonating elements. At least some of the resonating elements may be coupled to one another. In some of these embodiments, the resonating elements may have different dimensions. For example, the mechanical resonating structure may include at least one major element that has a large dimension that is larger than the large dimension of the minor element. In general, the minor elements have at least one smaller dimension (e.g., length, thickness, width) than the major element. Minor elements can have a shorter length than the major element. The minor elements may have nanoscale (i.e., less than 1 micron) dimensions. In some embodiments, at least one of the dimensions is less than 1 micron; and, in some embodiments, the large dimension (i.e., the largest of the dimensions) is less than 1 micron.

Suitable mechanical resonating structures have been described, for example, in International Publication No. WO 2006/083482, U.S. patent application Ser. No. 12/181,531, filed Jul. 29, 2008, and in U.S. patent application Ser. No. 12/142,254, filed Jun. 19, 2008 and published Oct. 1, 2009 as U.S. Patent Application Publication 2009-0243747, which are incorporated herein by reference in their entireties. It should be understood that a number of different designs for the mechanical resonating structure are also suitable.

FIG. 1 also shows one configuration of IDT electrodes and the resonating structure plate according to some embodiments. Other suitable configurations of electrodes can be employed as shall be discussed in further detail below.

Figure 2A:
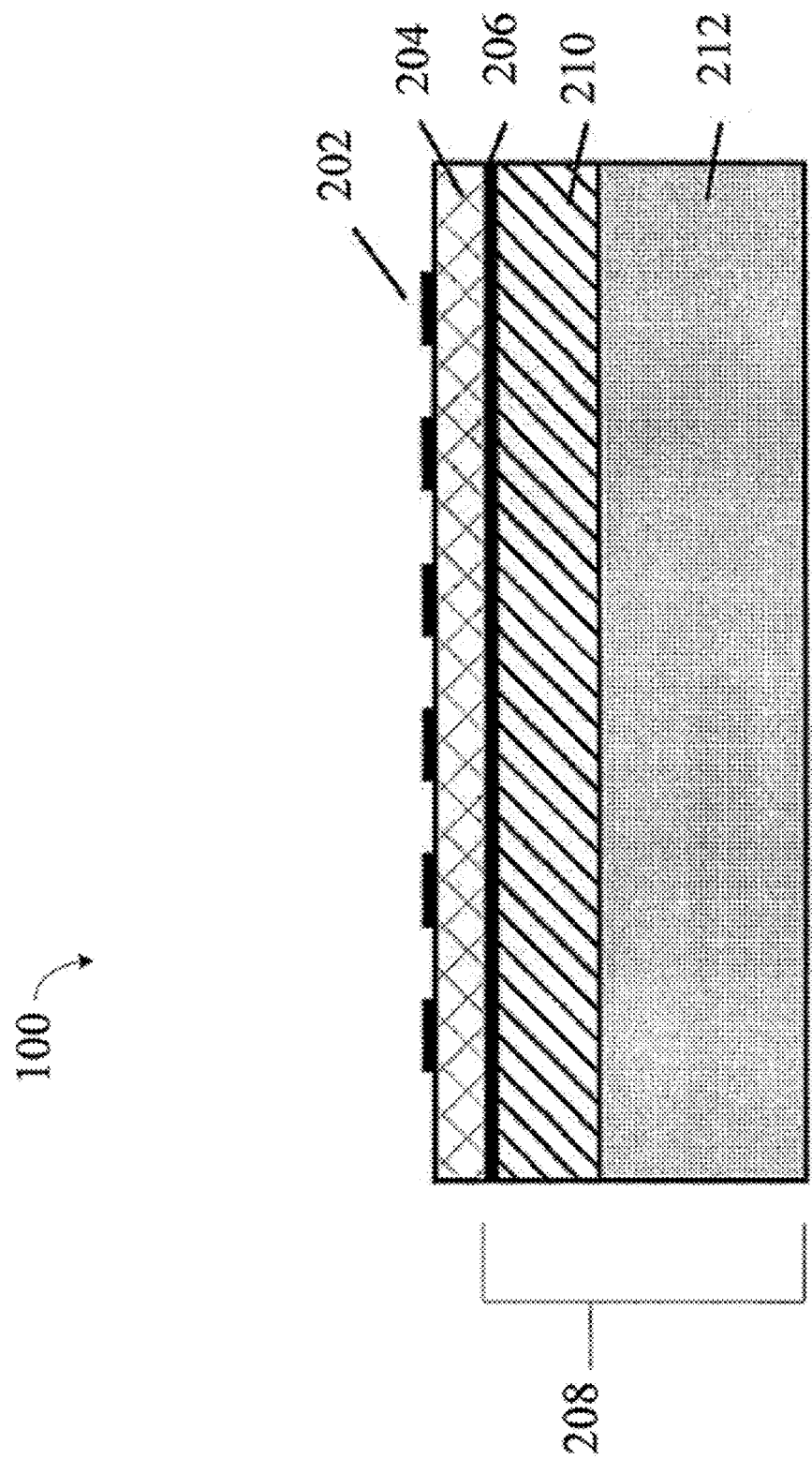
FIG. 2A shows a cross-sectional view of a mechanical resonating structure according to certain embodiments of the present disclosure.

FIG. 2A illustrates a lateral view of a mechanical resonating structure according to some embodiments. The mechanical resonating structure can be built using several components, layers, and materials including IDT electrodes 202, active layer 204, electrode layer(s) 206 and a compensating structure 208.

The active layer 204 responds to the transduction method used to actuate the mechanical resonating structure (i.e., cause to vibrate) and/or detect motion of the mechanical resonating structure. It should be understood that any transduction method may be used including piezoelectric, piezoresistive, electrostatic, electrostrictive, electromotive, magnetostrictive, magnetomotive, thermal, spin-torque effect, and spin-polarized current driven magnetic excitation, amongst others.

The active layer may have any suitable construction (including composition) which will depend, in part, on the transduction method used for actuation and/or detection. In some embodiments, the active layer is formed of a piezoelectric material. In some embodiments, the active layer is formed of a semiconductor material such as silicon. It should be understood that other compositions are also possible. In some cases, the active layer is formed of multiple layers. For example, the active layer may comprise multiple layers, one or more of which are functional (e.g., piezoelectric) and one or more of which are not.

As noted above, the active layer may be formed of a piezoelectric material. Examples of suitable materials include aluminum nitride (AlN), zinc oxide (ZnO), cadmium sulfide (CdS), quartz, lead titanate ($PbTiO_3$), lead zirconate titanate (PZT), lithium niobate ($LiNbO_3$), and lithium tantalate ($LiTaO_3$). In some embodiments, AlN may be preferred. Most active layer materials (e.g., silicon, piezoelectric materials) normally have a negative temperature coefficient of stiffness (TCS). That is, most active layer materials may become less stiff (also referred to as "softer") as temperature increases over a range. Stiffness, in general, can be associated with a resistance of a material to deform in response to an applied force.

As mentioned, according to one aspect of the present disclosure, a mechanical resonating structure may comprise a compensation structure, such as the compensation structure 208 of FIG. 2A. The compensation structure may be configured to provide a desired stiffness variation of the mechanical resonating structure and/or frequency of operation variation of the mechanical resonating structure over a desired temperature range (e.g., an anticipated operational temperature range of the mechanical resonating structure) for one or more modes of vibration of interest. In some embodiments, the composition of the active layer of the mechanical resonating structure may be considered in configuring the compensation structure, as the composition of the active layer may impact the stiffness variation of the active layer with temperature, which is to be compensated by the compensation structure in some embodiments. According to one embodiment, the compensation structure may be configured to provide the mechanical resonating structure with a TCF having an absolute value of less than approximately 1 ppm/K over a temperature range of at least 40° C. centered around room temperature (25° C.) for one or more modes of Lamb waves when the active layer is formed of aluminum nitride. However, this is merely a non-limiting example provided for purposes of illustration.

In the illustrated embodiment of FIG. 2A, active layer 204 is formed on compensation structure 208. Other configurations are also possible. For example, in some cases, the compensation structure may be formed on the active layer.

As shown, compensation structure 208 includes multiple components (e.g., layers). In general, characteristics (e.g., composition, dimensions, and arrangement within the structure) of the components (e.g., layers) are selected such that structure 208 provides the desired compensation with respect to the active layer and any additional layers to be compensated, so that the mechanical resonating structure exhibits a desired behavior across a range of temperatures for any modes of vibration of interest.

In the embodiment shown in FIG. 2A, the compensating structure includes a first layer 210 and a second layer 212. The stiffness of layers 210, 212 may vary differently with temperature. For example, layer 210 may have a stiffness that increases with increasing temperature over a temperature range (i.e., a positive TCS). Layer 212 may have a stiffness that decreases, or stays relatively constant, with increasing temperature over a temperature range (i.e., a negative TCS). As described further below, the arrangement of the first and second layers (e.g., dimensions, location within structure) may be selected to impart the mechanical resonating structures with desired behavior across a range of temperatures. For example, the arrangement may be selected so that the resonating structures have a relatively constant stiffness over a temperature range. That is, the TCS may approach or be equal to 0. This may contribute to minimizing the frequency variation over the temperature range (e.g., TCF may approach or be equal to 0). Thus, it should be appreciated that in some embodiments the temperature compensation structure may compensate for temperature-induced variations in stiffness of layers other than the active layer (but in addition to the active layer in some embodiments) of the mechanical resonating structure, e.g., one layer of the temperature compensation structure may compensate for temperature-induced stiffness variations of another layer of the temperature compensation structure.

It should be understood that, in certain embodiments, the compensating structure may include one or more layers in addition to those shown in FIG. 2A. Some of these embodiments are described further below. The additional layer(s) may have the same composition as one of the first or second layers. In other embodiments, the additional layer(s) may have a different compensation than both the first and second layers.

In some embodiments, the compensation structure may be formed of only a single layer (e.g., first layer 210). In one such embodiment, for example, the active layer may be formed of silicon and the single layer of the compensation structure may be formed of $SiO_2$. In an alternative such embodiment, the active layer may be formed of aluminum nitride (AlN) and the single layer of the compensation structure may be formed of silicon dioxide ($SiO_2$). Other choices for the materials may also be used.

The first layer can have characteristics that are selected so that it has a positive TCS (i.e., TCS>0) over a temperature range. For example, the composition of the first layer may be selected to provide a positive TCS. Suitable compositions can include $SiO_2$ and $Al_2O_3$, amongst others. In some cases, $SiO_2$ may be preferred. In some cases, the first layer may be composed of a series of ultra-thin layers (e.g., less than 10 nm thick) which are combined to produce an overall layer having a positive TCS. The positive TCS may also, or alternatively, be engineered by implanting species (e.g., ions, neutrons) into the first layer. Thus, it should be understood that a layer exhibiting a positive TCS may be obtained in any of a number of suitable ways, and that the various aspects described herein including one or more layers exhibiting a positive TCS are not limited in the manner in which the positive TCS is obtained.

As noted above, first layer 210 can have a positive TCS over a temperature range. In some cases, the TCS is positive across the entire operating temperature range of the device.

For example, the TCS may be positive across the temperature range of between −55° C. and 150° C., or between −40° C. and 85° C. However, in other cases, the TCS of first layer 210 may be positive across a portion of the operating range, and negative across other portion(s). The TCS of the first layer may be positive across the majority of the temperature range. In some embodiments, the TCS of the first layer may be positive across a range of at least 200° C.; in some embodiments, at least 100° C.; and, in other embodiments, at least 50° C.

As noted above, second layer 212 may have a different stiffness-temperature dependence than the first layer. The second layer may be a support layer that provides robustness to the first layer. The second layer may be formed of a material having a lower acoustical loss than the material of the first layer. In some embodiments, the second layer is formed of a material having a certain crystal structure. For example, the second layer may be formed of a single crystal material and/or a material having higher crystal quality than the material of the first layer (e.g., lower defects). In particular, when the first layer comprises $SiO_2$, the robustness and support provided by the second layer is useful, since a structure comprised of a thin $SiO_2$ layer(s) and the active layer can be fragile and prone to damage if subjected to forceful mechanical movements or vibrations. The second layer can also provide improved signal performance (e.g., less noise and better Q-factor). Suitable materials for second layer 212 include silicon, diamond, silicon carbide, sapphire, quartz, germanium, aluminum nitride, and gallium arsenide, amongst others. In some embodiments, it is preferable for the second layer to be formed of silicon.

The embodiment of FIG. 2A includes IDT electrodes 202 and an electrode layer 206 to facilitate transfer of charges and electric potential across a mechanical resonating structure. The number of electrodes and placement of electrodes can be important as they can determine the types of acoustic waves and excitation modes generated by the mechanical resonating structure's motion.

Examples of suitable electrode materials include, but are not limited to, aluminum (Al), molybdenum (Mo), titanium (Ti), chromium (Cr), ruthenium (Ru), gold (Au), platinum (Pt) or AlSiCu. In general, any suitable electrode material can be utilized for the electrode layer. In some embodiments, a thin layer of Ti and/or MN may be added beneath the electrode to enhance crystal orientation of the active (e.g., piezoelectric) material layer.

Figure 2B:
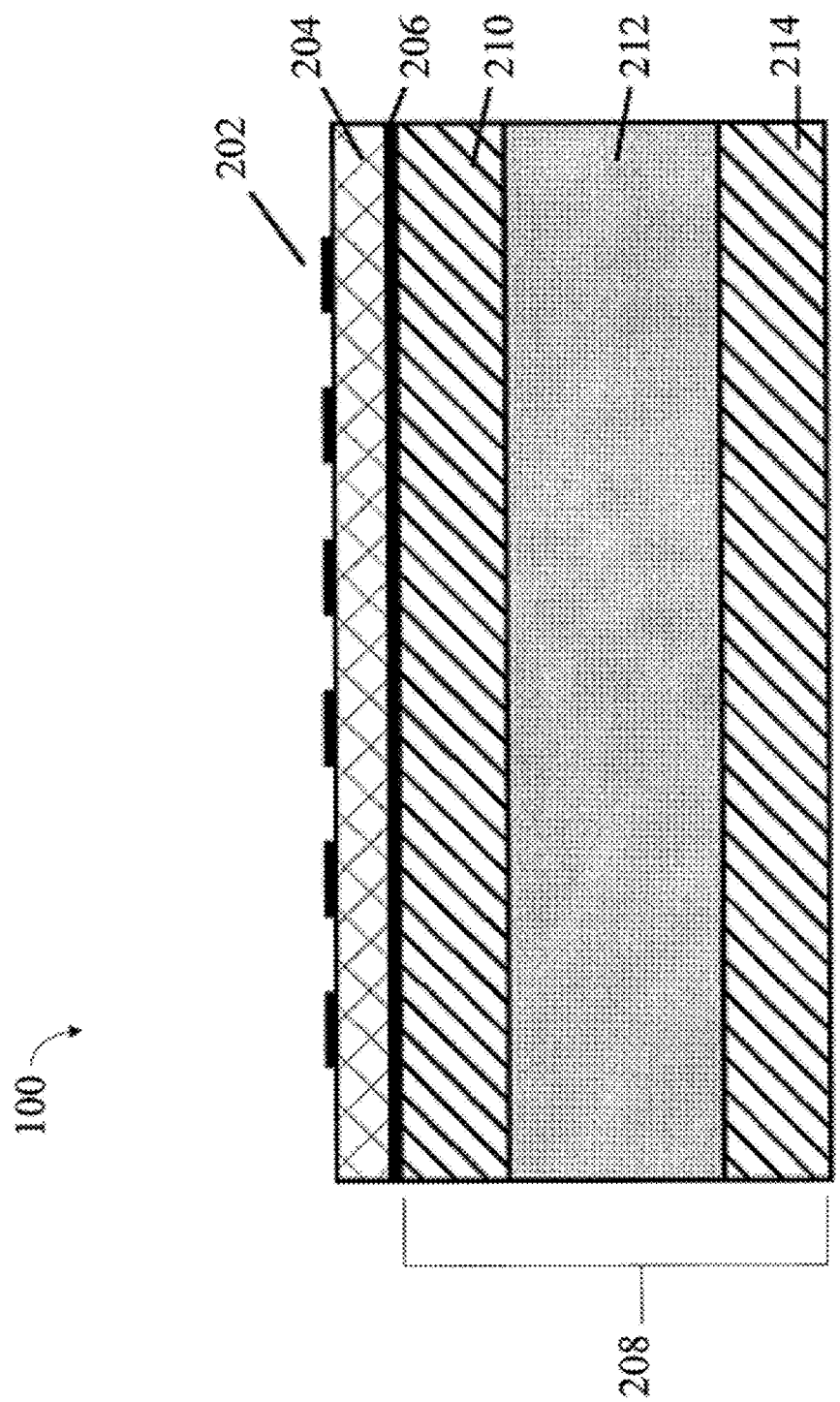
FIG. 2B shows a cross-sectional view of a mechanical resonating structure according to certain embodiments of the present disclosure.

FIG. 2B illustrates another embodiment in which the compensating structure includes a third layer 214. In some cases, the third layer may be formed of a material having a positive TCS. Suitable materials having a positive TCS were described above in connection with first layer 210. In some embodiments, the third layer comprises the same material as first layer 210. However, in other embodiments, the third layer may comprise a different material than the first layer (and the second layer). In some embodiments, layers 210 and 214 are formed of $SiO_2$ layers. In some of these cases, the second layer 212 is formed of Si. As shown, the second layer is positioned between the first layer and the third layer. Other arrangements are possible.

In some embodiments, the third layer has a similar thickness as the first layer. For example, the ratio of the thickness of the third layer to the thickness of the first layer may be between 1:0.25 and 1:4.0, between 1:0.75 and 1:1.25, or about 1:1. For example, the listed ratios may be suitable when the third layer is formed of the same composition as the first layer (e.g., when the first and third layers are both formed of $SiO_2$, or any other suitable material (e.g., any other suitable positive TCS material)).

In some cases, the three-layer compensation structure configuration illustrated in FIG. 2B may provide enhanced performance as compared to a two-layer compensating structure. For example, such a configuration can reduce the tendency of the resonating structure to bend out of plane by balancing residual stress in the structure. This can provide a high Q, low noise signal. In some embodiments, a split-layer compensation structure similar to that illustrated in FIG. 2B may facilitate fabrication of the structure. For example, as mentioned, in one embodiment the layers 210 and 214 may be formed of the same material (e.g., $SiO_2$). Rather than forming a single layer of the material having a thickness approximately equal to the combined thickness of layers 210 and 214, the configuration of FIG. 2B may be used in which separate layers 210 and 214 are formed. In this manner, fabrication defects associated with forming thick material layers (e.g., cracking, bending, warping, etc.) may be minimized or avoided, as may be out-of-plane deformation of the mechanical resonating structure.

It should be understood that the compensation structure may have a variety of different configurations in addition to those shown in FIGS. 2A and 2B. For example, the compensation structure may include more than three layers. In some cases, the compensation structure may include at least one additional layer having a similar function as second layer 212 described above. The additional one or more layer(s) may be formed of a material having a lower acoustical loss than the material of the first layer including those noted above. In some cases, the additional one or more layer(s) is formed of silicon. As noted above, the compensation structures can be designed to provide the mechanical resonating structure with a desired frequency variation with temperature (e.g., TCF) for one or more modes of interest. In some embodiments, it may be desirable for the TCF to approximate or be equal to zero over a range of temperatures for one or more modes of Lamb waves, or for any other modes of interest. That is, in these cases, the compensating structure can enable the mechanical resonating structure to operate with little or no variation in frequency over a range of temperatures.

However, in some embodiments, it may be desirable for the TCF to be non-zero at least over certain temperature ranges. Thus, in these cases, the frequency of the mechanical resonating structure may vary a desired amount with temperature. In these embodiments, the compensation structure is designed to achieve the desired amount of variation.

In some embodiments, the mechanical resonating structure has an absolute value of a TCF of less than 10 ppm/K over a range of temperatures. For example, the absolute value of the TCF may be less than 10 over an anticipated operating range of the mechanical resonating structure (e.g., from −40° C. to 85° C.). In some embodiments, the absolute value of the TCF is less than 6 ppm/K over a range of temperatures, for example from −40° C. to 85° C. In some embodiments, the absolute value of the TCF over the range of temperatures (e.g., from −40° C. to 85° C.) is less than 5 ppm/K, or less than 3 ppm/K, less than 2 ppm/K or less than 1 ppm/K. In some cases, the TCF may approximately equal 0 (which includes exactly equaling zero) over a range of at least 5° C. or at least 10° C. within the range from −40° C. to 85° C., as a non-limiting example. Other values are also possible. For example, in some embodiments the absolute value of the TCF may be less than 4 ppm/K, less than 1 ppm/K, less than 0.5 ppm/k, or approximately zero, over a range of temperature spanning at least 40° C. (e.g., a range of temperatures spanning at least 40° C. and centered approximately at room temperature, 25° C.).

The range of temperatures over which the desired TCF is achieved may depend on the application. In some cases, the temperature range may be broad. For example, the temperature range may be between −55° C. and 150° C.; or, −40° C. to 85° C. The range may span at least 200° C., at least 100° C., at least 75° C., at least 50° C., or at least 40° C. In other embodiments, the range of temperature over which the desired TCF is achieved may be more narrow. For example, the temperature range may be less than 50° C., less than 25° C., or less than 10° C. In general, the above-noted ranges of temperatures can be centered around any desired temperature. For example, they may be centered around room temperature (i.e., 25° C.), an elevated temperature such as 100° C., or otherwise.

The compensation structure may be designed to result in a mechanical resonating structure with a desired TCF by selecting appropriate characteristics for the compensation structure. For example, the characteristics may include the composition, dimensions, and arrangement of layers within the structure.

In some embodiments, there may be a desired thickness ratio between layers in the structure. In some cases, the thickness of the active layer (e.g., layer 204) and the total thickness of the positive TCS material layer(s) (e.g., layer 210 in FIG. 2A and layers 210, 214 in FIG. 2B) may be selected to provide a desired ratio. The ratio of the thickness of the active layer to the total thickness of the positive TCS material layer(s) may be between 1:1 and 1:500, or between 1:1 and 1:200 in some non-limiting embodiments. In some embodiments, the ratio may be between 1:1 and 1:10, or between 1:4 and 1:8, or between 1:5 and 1:7 (e.g., about 1:6). In some such embodiments, the active layer may be formed of aluminum nitride and the positive TCS material of the compensation structure may be formed of silicon dioxide, although other materials may be used for the active layer and positive TCS material layer, as those listed are merely examples. In embodiments which include more than one layer formed of a positive TCS material, the total thickness of the positive TCS material layer(s) includes the sum of the thickness of all such layers. In embodiments which include a single layer formed of a positive TCS material, the total thickness of the positive TCS material layer(s) is the thickness of that single layer. The above-noted ratios, for example, may be suitable when the positive TCS material in the layer(s) is $SiO_2$ and the active material is a piezoelectric material such as MN. Other ratios may be suitable depending on the materials used.

In some cases, the thickness of the positive TCS material layer(s) and the thickness of the layer(s) having a lower acoustic loss than the positive TCS material layer(s) (e.g., layer 212) are selected to provide a desired ratio. For example, the ratio of the total thickness of the positive TCS material layer(s) (e.g., the combined thickness of multiple positive TCS layers in those embodiments in which the compensation structure includes multiple positive TCS layers) and the layer(s) having a lower acoustic loss than the positive TCS material layer(s), may be between 1:0.1 and 1:10, 1:0.5 and 1:3, between 1:0.75 and 1:1.25, or between 1:1 and 1:2. The above-noted ratios may be suitable when, for example, the positive TCS material in the layer(s) is $SiO_2$ and the layer(s) having a lower acoustic loss than the positive TCS material layer(s) is/are formed of Si. These ratios may be suitable when the active material is a piezoelectric material such as AlN.

According to some embodiments, the ratio of the thickness of the active layer(s) of the mechanical resonating structure compared to the thickness of any layers of the temperature compensation structure having lower acoustic loss (e.g., layer 212) may be designed to fall within certain ranges. For example, according to one embodiment the ratio of the thickness of the active layer to the total thickness of one or more layers of the temperature compensation structure having lower acoustic loss than the positive TCS layer(s) may be between 1:0.1 and 1:500, and in some embodiments may be between 1:0.5 and 1:20. Such ratios may be suitable when the active layer comprises, for example, AlN, and the layer of lower acoustic loss material comprises, for example, silicon. Other materials and other ratios may be used, however, as those listed are not limiting.

It should be understood that certain embodiments may include layer thicknesses outside of the above-noted ranges.

FIGS. 2-3D and FIGS. 3H-3J illustrate some embodiments of the present disclosure. Other configurations of a mechanical resonating structure can be utilized. For example, FIGS. 4A-4C illustrate 3 different configurations of a mechanical resonating structure. As shown in FIG. 4A, a top electrode 202A can be placed on top of active layer 204 (e.g., AlN). The compensating structure can be situated below the active layer with IDT electrodes 202 located at an interface of the compensating structure and the active layer. The compensating structure can be a Si layer 212 placed between two $SiO_2$ layers 210, 214 of equal thickness. FIG. 4A illustrates a configuration in which the IDT electrodes are not placed on the top surface of the mechanical resonating structure and in which the active layer is planarized. In contrast, FIG. 4B illustrates a similar structure to FIG. 4A with a difference that the top electrode and active layer are not planarized. FIG. 4C also illustrates a configuration similar to FIG. 4A; however, in contrast to FIG. 4A, the IDT electrodes in FIG. 4C are embedded in a first $SiO_2$ layer of the compensating structure.

Figure 4A:
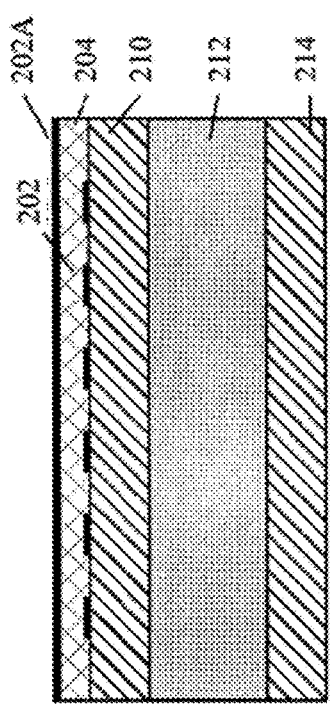
FIG. 4A shows a diagram of a planarized configuration of a mechanical resonating structure according to embodiments of the present disclosure.
Figure 4B:
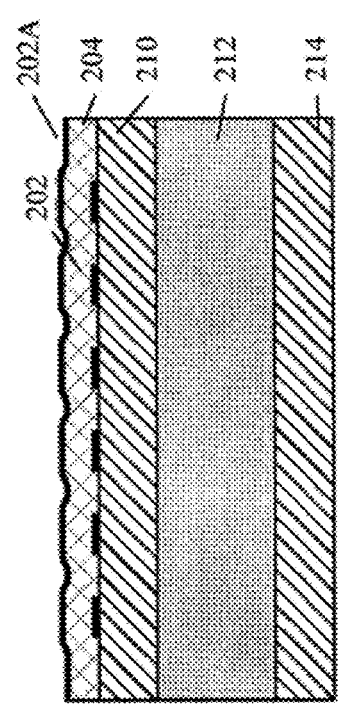
FIG. 4B shows a diagram of a non-planarized configuration of a mechanical resonating structure according to embodiments of the present disclosure.
Figure 4C:
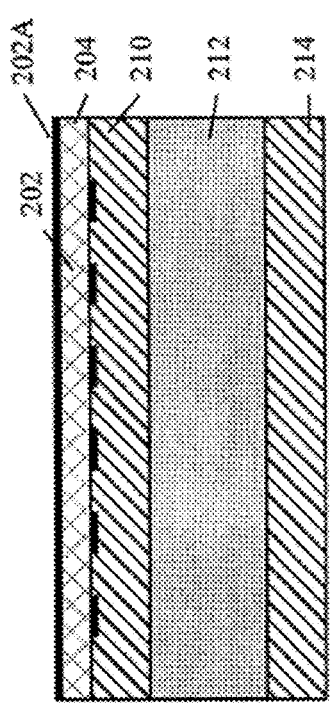
FIG. 4C shows a diagram of a configuration of a mechanical resonating structure according to embodiments of the present disclosure.
Figure 5A:
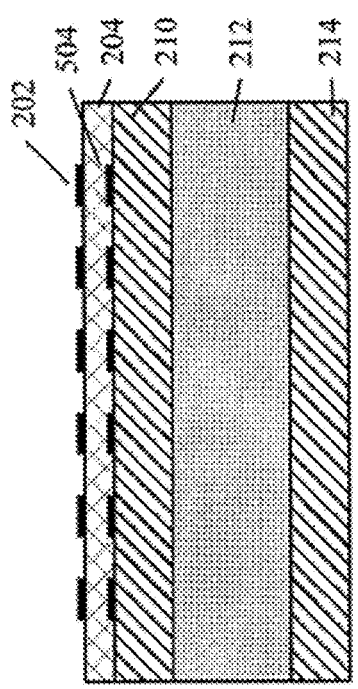
FIG. 5A shows a diagram of a planarized configuration of a mechanical resonating structure with top and bottom electrodes according to embodiments of the present disclosure.
Figure 5B:
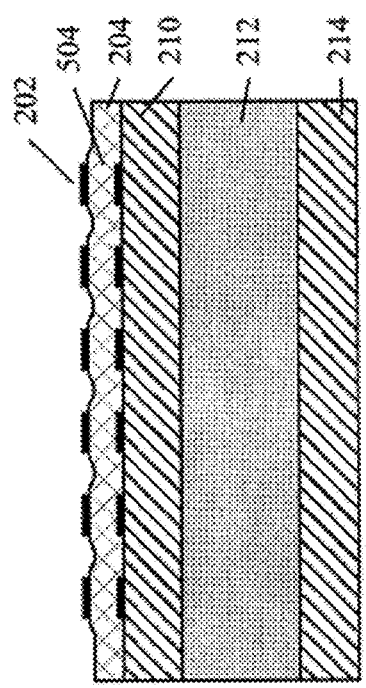
FIG. 5B shows a diagram of a non-planarized configuration of a mechanical resonating structure with top and bottom electrodes according to embodiments of the present disclosure.
Figure 5C:
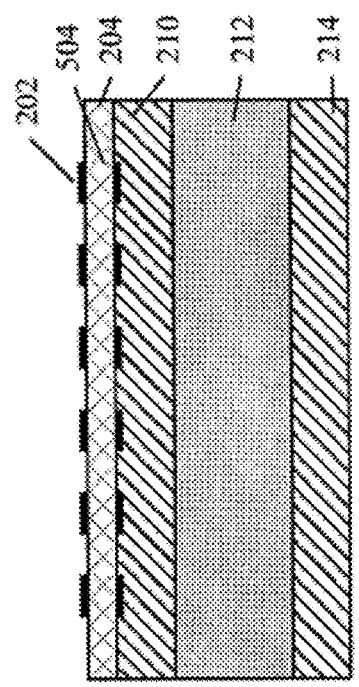
FIG. 5C shows a diagram of a configuration of a mechanical resonating structure with top and bottom electrodes according to embodiments of the present disclosure.

FIGS. 5A-5C illustrate another set of embodiments in which top 202 and bottom 504 IDT electrodes are used in a mechanical resonating structure. For example, in FIG. 5A, bottom electrodes are placed within the active layer 204 at an interface with the compensating structure as in FIGS. 4A and 4B. However, an additional set of top IDT electrodes are deposited on the top surface of the active layer. FIG. 5B illustrates a non-planarized structure as compared to the planarized structured in FIG. 5A. FIG. 5C shows the bottom IDT electrodes being situated within the first $SiO_2$ layer 210 of the compensating structure. As can be appreciated from the descriptions of FIGS. 4A-5C, various configurations of a mechanical resonating structure with zero TCS can be designed and utilized.

A mechanical resonating structure can be manufactured using simple fabrication processes. As an example, FIGS. 6A-6G and FIGS. 7A-7F illustrate two possible processes used to fabricate a mechanical resonating structure according to embodiments of the present disclosure. It should be understood that other fabrication techniques are also possible including techniques in which the specific process steps are re-arranged in a different order.

Figure 6B:
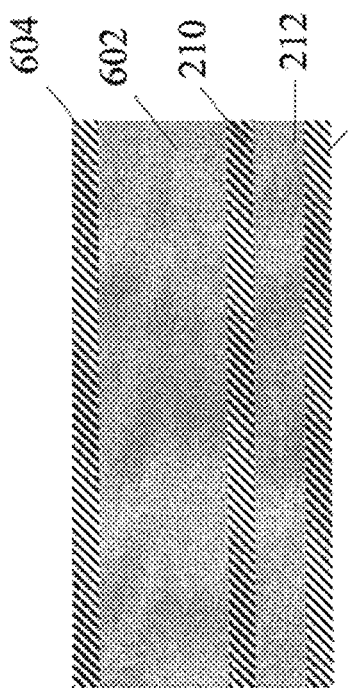
Figure 6D:
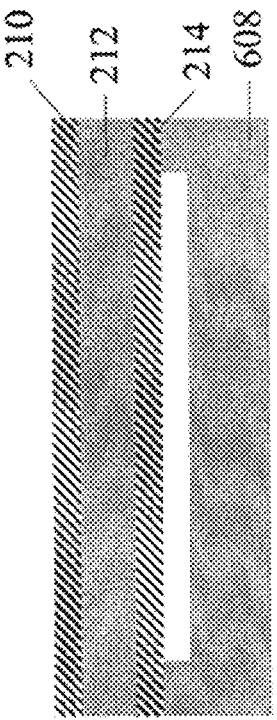
Figure 6A:
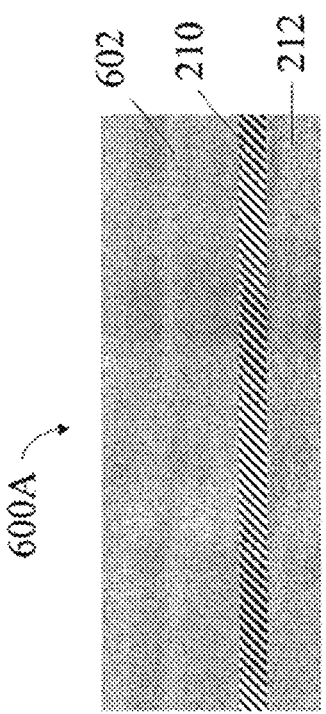

A first fabrication process is shown in FIGS. 6A-6G. Structure 600A, including a handle layer 602, a first layer 210 with a stiffness that increases with temperature (e.g., $SiO_2$ or any suitable oxide layer), and a second layer 212 with a stiffness that decreases with temperature (e.g., Si), can be used to commence the fabrication process. As shown in FIG. 6A, the first layer can be buried between the handle layer and the second layer. In some embodiments, the handle and second layers can be Si layers.

Figure 6C:
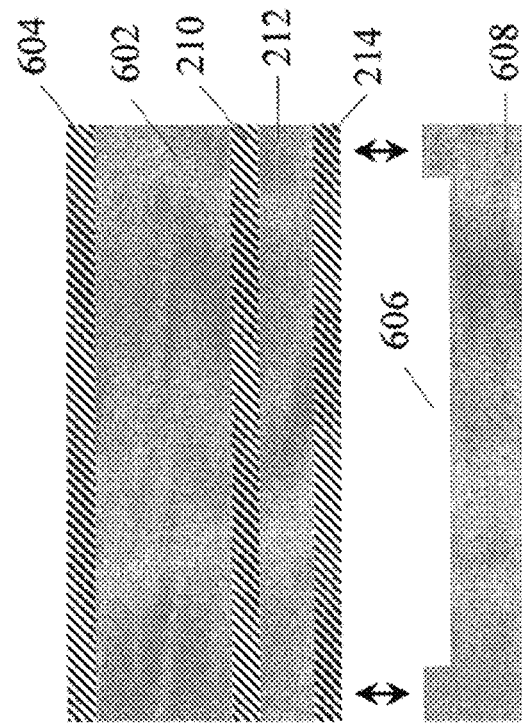

Next, as shown in FIG. 6B, thermal oxide layers 604, 214 can be formed on a top surface of the handle layer and a bottom surface of the second layer using a suitable thermal oxidation procedure. The added thermal oxide layers can be similar to a thickness of the buried first layer 210. Subsequently, a wafer 608 with cavity 606 can be bonded to structure 600A, as illustrated in FIG. 6C. Bonding the wafer to structure 600A yields a modified structure 600B with a predefined cavity. Subsequently, as illustrated in FIG. 6D, the handle layer 602 and oxide layer 604 can be removed and a planarized top first layer may be formed using any suitable planarization procedure (e.g., chemical mechanical planarization (CMP). After the planarization process, a bottom electrode layer 206, an active layer 204 and a top electrode layer 202A can be deposited on the top, planarized surface of first layer 210 (FIG. 6E). Suitable deposition techniques include, for example, chemical vapor deposition (CVD) and physical vapor deposition (PVD). In general, any suitable deposition technique can be used. Portions of the top electrode layer can then be selectively removed using any suitable photolithography process. The selective removal can result in formation of IDT electrodes 202 as shown in FIG. 6F. As a next step, the active layer, the electrode layer, the first layer, the second layer and the oxide layer can be etched until the cavity is reached to yield a suspended resonating structure 100 as shown in FIG. 6G. Anchors and other components (e.g., pads, vias) compensating the suspended resonating structure are not shown in FIG. 6G.

Figure 7E:
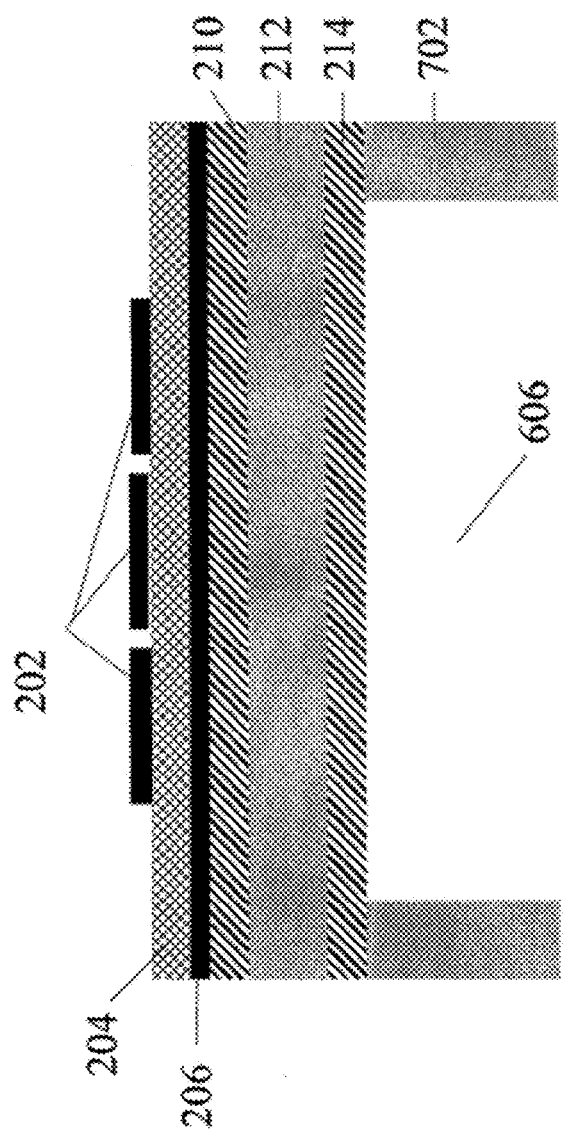
Figure 7F:
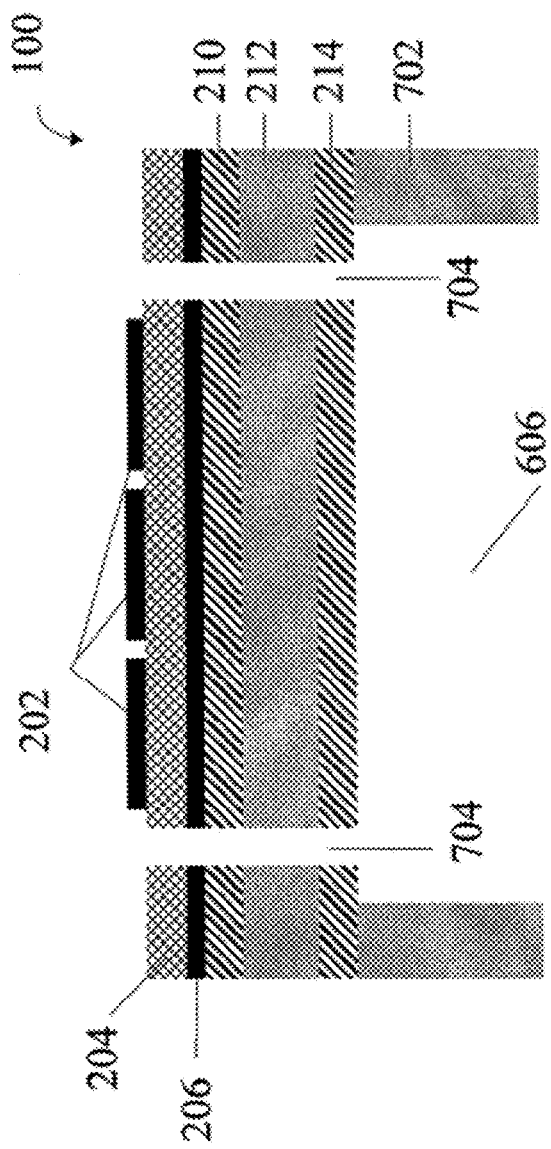

FIGS. 7A-7F illustrate another process that can be used to fabricate a mechanical resonating structure according to some embodiments. Like the first process, a structure 700A with a handle layer 702, an oxide layer 214 and a second layer 212 with a stiffness that decreases with temperature (e.g., Si) can be used to commence the fabrication process. A first layer 210 with a stiffness that increases with temperature (e.g., $SiO_2$ or any suitable oxide layer), a bottom electrode layer 206, an active layer 204 and a top electrode layer 202A can be deposited on the second layer as shown in FIGS. 7B and 7C. The first layer 210 can have the same thickness as oxide layer 214. Examples of suitable deposition techniques have been described above. Subsequently, the top electrode layer is partially removed to form IDT electrodes 202 as described above and shown in FIG. 7D. Using a bottom-up dry or wet etch process, the handle layer is selectively etched to the bottom surface of oxide layer 214 to form a cavity 606 as shown in FIG. 7E. Further etching 704 of the active layer, the bottom electrode layer, the second layer, the first layer and the oxide layer can result in a suspended resonating structure 100 illustrated in FIG. 7F.

It should be understood that other configurations and/or fabrication processes can be used for a mechanical resonating structure.

The mechanical resonating structures described herein can be incorporated into a variety of devices. According to some embodiments, a mechanical resonating structure can be integrated in tunable meters, mass sensors, gyros, accelerometers, switches, and electromagnetic fuel sensors. According to some embodiments, the mechanical resonating structure can be integrated in a timing oscillator. Timing oscillators can be used in several devices including digital clocks, radios, computers, oscilloscopes, signal generators, and cell phones. Timing oscillators can precisely generate clock signals, for example, as a reference frequency to help synchronize other signals that are received, processed, or transmitted by a device in which the timing oscillator is integrated. In some scenarios, multiple processes are run simultaneously on a device and the execution of such processes rely on a clock signal that can be generated by the mechanical resonating structure. According to some embodiments, a mechanical resonating structure can also be coupled to additional circuitry. For example, additional circuitry may include filters, mixers, dividers, amplifiers or other application specific components and devices.

Figure 10A:
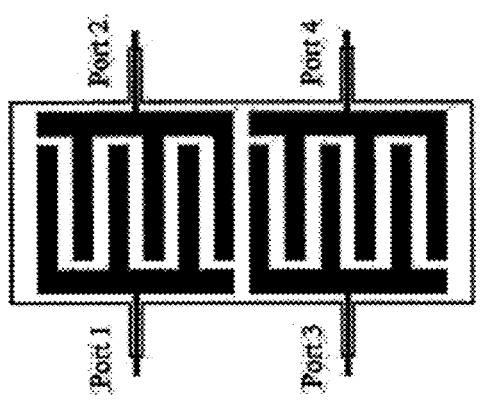
FIGS. 10A-10B illustrate a four-port mechanical resonating structure according to embodiments of the present disclosure.
Figure 10B:
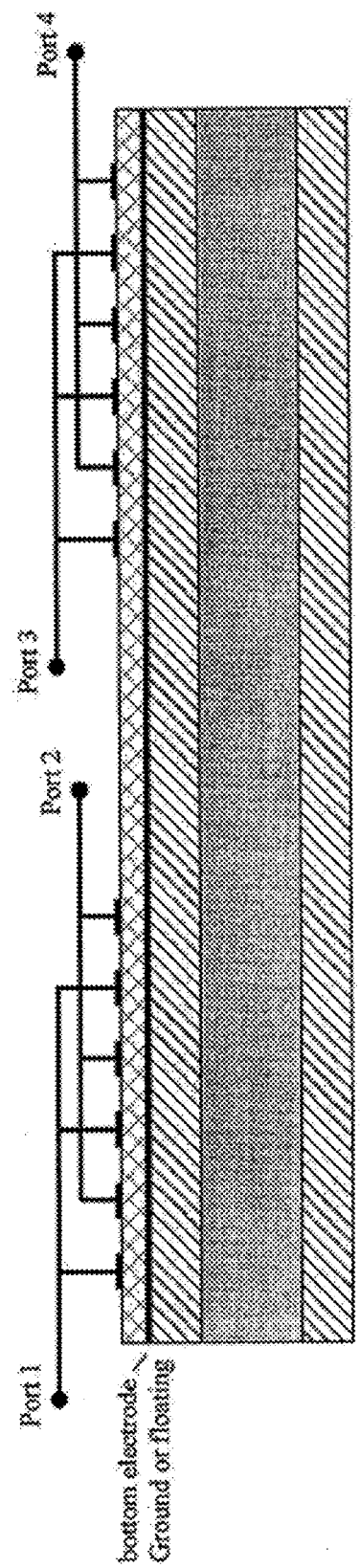

In some embodiments, the mechanical resonating structure can be used as a multiple port device. For example, as illustrated in FIGS. 9A and 9B, the bottom electrode can be grounded, while the IDT electrodes are coupled to two ports, namely Port 1 and Port 2. Alternatively, the bottom electrode could be a floating node. In another example illustrated in FIGS. 10A and 10B, a dual mechanical resonating structure can be utilized to create a four-port mechanical resonating structure device. In the dual mechanical resonating structure configuration, two mechanical resonating structures can be implemented on the same resonating structure plate and the ports can be connected to the desired inputs and outputs.

The following example is provided for illustration purposes and is not intended to be limiting.

The following is an example that illustrates that the TCF of a mechanical resonating structure can be controlled according to the methods described herein with reference to FIGS. 3A-3J. In this example, layers 210, 214 are formed of $SiO_2$ and layer 212 is formed of Si.

FIG. 3E is an indicator of how the TCF varies as a function of temperature. Specifically, FIG. 3E shows a graph of the normalized frequency variation ($\Delta f/f$) versus temperature. The TCF corresponds to the slope of this curve. As noted above, the active layer can have a negative TCF, and $SiO_2$ can have a positive TCF for a specified range of temperatures.

FIG. 3A shows an example of a mechanical resonating structure with an active layer (e.g., MN), a bottom electrode, a Si layer 212 and no $SiO_2$ layers. This structure has a negative TCF of approximately −30 ppm/K (illustrated by line A in FIG. 3E). FIG. 3B shows an example of a mechanical resonating structure with a Si layer placed between two $SiO_2$ layers as discussed above. The $SiO_2$ layers have a relatively small thickness compared to the Si layer and to corresponding $SiO_2$ layers in FIGS. 3B and 3C. As illustrated by line B in FIG. 3E, the low thickness can result in a TCF that is still negative but greater (i.e., less negative) than the TCF of the mechanical resonating structure in FIG. 3A. The structure shown in FIG. 3C is similar to the mechanical resonating structure in FIG. 3B; however, in FIG. 3C, both $SiO_2$ layers have greater thicknesses. The corresponding line, C, in FIG. 3E indicates an almost zero TCF for the mechanical resonating structure in FIG. 3C. If the thickness of the $SiO_2$ layers is further increased, as shown in FIG. 3D, then the TCF of the mechanical resonating structure becomes non-zero and positive, as shown by D in FIG. 3E. Accordingly, in these embodiments, the thinner the thickness of the $SiO_2$ layers, the more negative the TCF of the mechanical resonating structure.

Figure 3F:
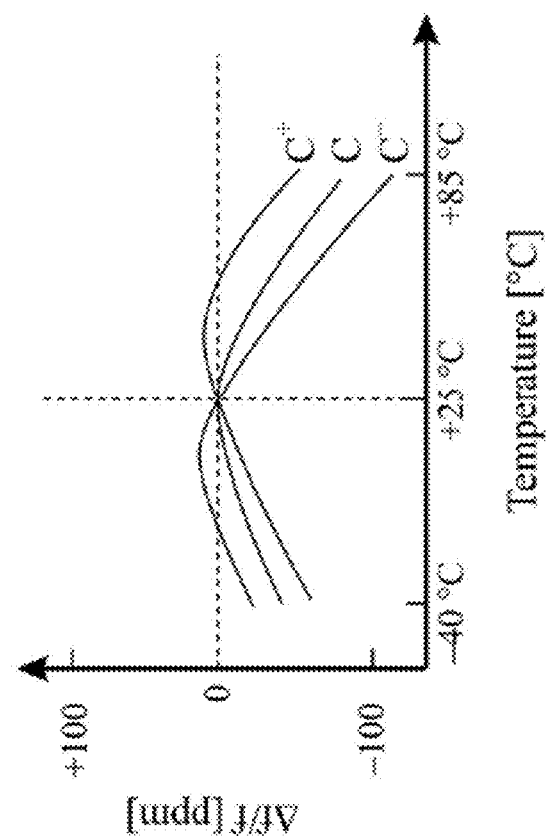
FIG. 3F shows a graph of a mechanical resonating structures' non-linear temperature coefficient of frequency behavior according to embodiments of the present disclosure.

While FIG. 3E illustrates an example of how the normalized frequency variation ($\Delta f/f$) over temperature can be 'leveled' and, therefore, the TCF approaches zero over a range of temperatures by selecting appropriate thicknesses for layers of a mechanical resonating structure device, in certain cases it may be more challenging to achieve a flat response over a broad range of temperatures (e.g., −40° C. to 85° C.), since many materials have non-linear TCF properties. For example, some materials may have higher order TCF properties. For such materials, the mechanical resonating structure may be designed and/or tuned to provide zero TCF properties around the operating temperature (e.g., room temperature) or any other desired/pre-determined temperature of the mechanical resonating structure. For example, as illustrated in FIG. 3F, a non-linear curve C can have a zero TCF at room temperature (i.e., 25° C.) if suitable thicknesses are chosen for the mechanical resonating structure layers. If, for example, a slightly thicker $SiO_2$ layer is used, a zero TCF can be achieved at a temperature greater than room temperature, as indicated by curve $C^+$; however, if a slightly thinner $SiO_2$ layer is used, a zero TCF can be achieved at a temperature lower than room temperature, as indicated by curve C⁻.

Figure 3G:
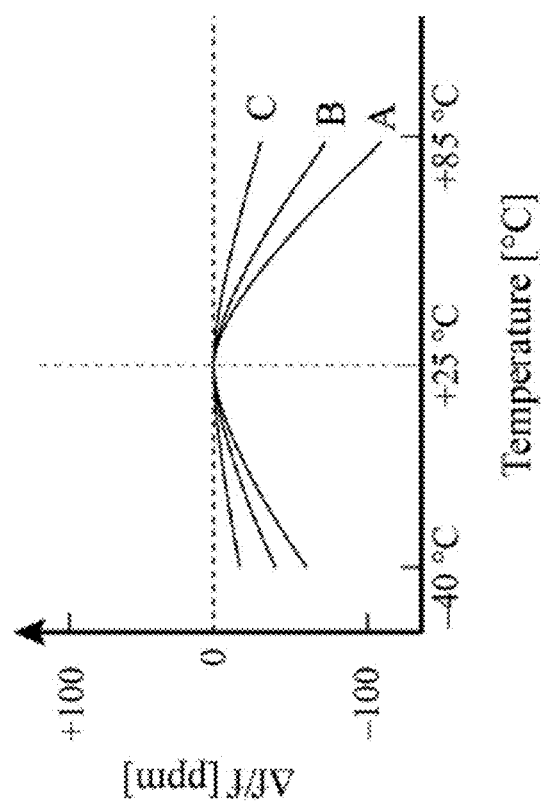
FIG. 3G shows a graph of a mechanical resonating structures' non-linear temperature coefficient of frequency behavior where all the structures have a zero temperature coefficient of frequency at room temperature according to embodiments of the present disclosure.

The thicknesses of the mechanical resonating structure layers may not only determine where a zero TCF is achieved in a broad range of temperatures, but may also help reduce the higher-order nature of the mechanical resonating structure layers' non-linear TCF properties. FIG. 3G, for example, shows the parabolic TCF profile of three mechanical resonating structures A, B and C illustrated in FIGS. 3H-3J. Structure C has a smaller $Si/SiO_2$ layer thickness than structure B, which has a smaller $Si/SiO_2$ layer thickness than structure A. Due to differences in a ratio of the thickness of the active material to the thickness of the Si layer and/or the $SiO_2$ layers, the parabolic profile of all three structures can be different despite having a zero TCF at room temperature. For example, as shown in FIG. 3G, since structure A has the thickest $SiO_2$ layers, structure A maintains its higher order characteristic with a severely parabolic TCF profile as shown by curve A. In comparison, curve B has a less parabolic TCF profile. Curve B corresponds to structure B, which has smaller $SiO_2$ layer thickness than structure A. Similarly, as shown by curve C, structure C has the least parabolic TCF profile since structure C has the thinnest $SiO_2$ layers.

It is possible for the ratio of the thickness of the active material to the thickness of the Si layer and/or the $SiO_2$ layers to vary during the manufacturing process of mechanical resonating structures. Variances in thickness ratios can result in a mechanical resonating structure having a zero TCF that is offset from room temperature such as curves $C^+$ and $C^-$ of FIG. 3F, and/or has a severe parabolic TCF profile such as curve A of FIG. 3G.

Figure 11A:
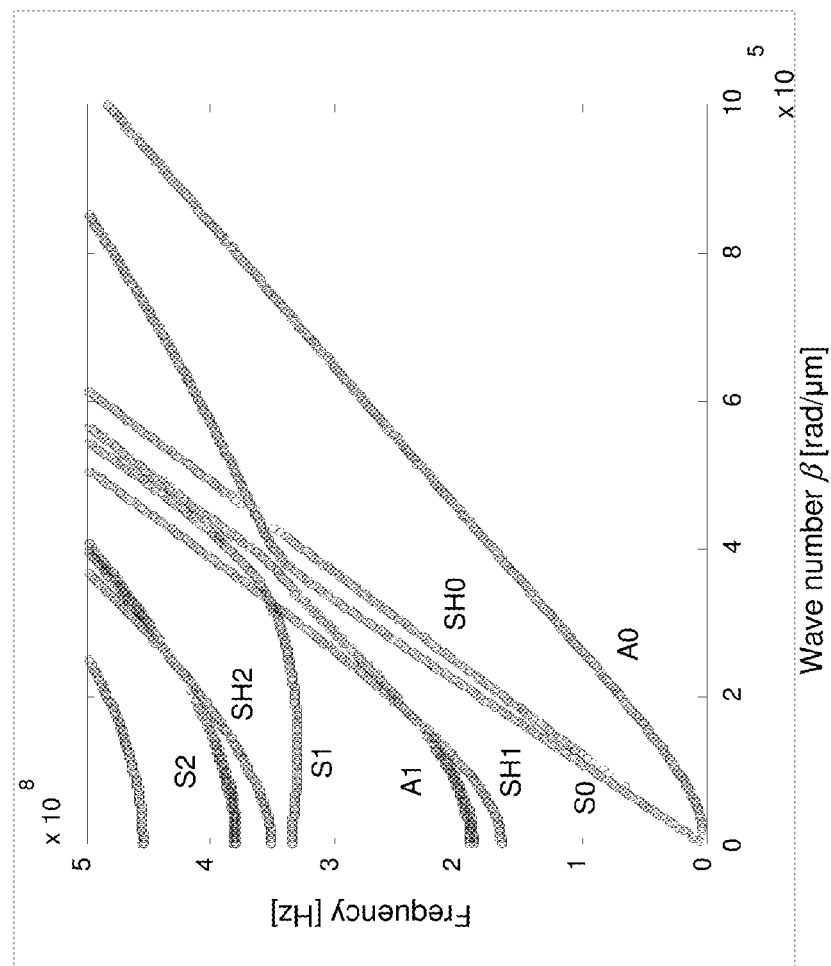
FIGS. 11A-11B depict dispersion of plate modes of operation of a mechanical resonating structure.
Figure 11B:
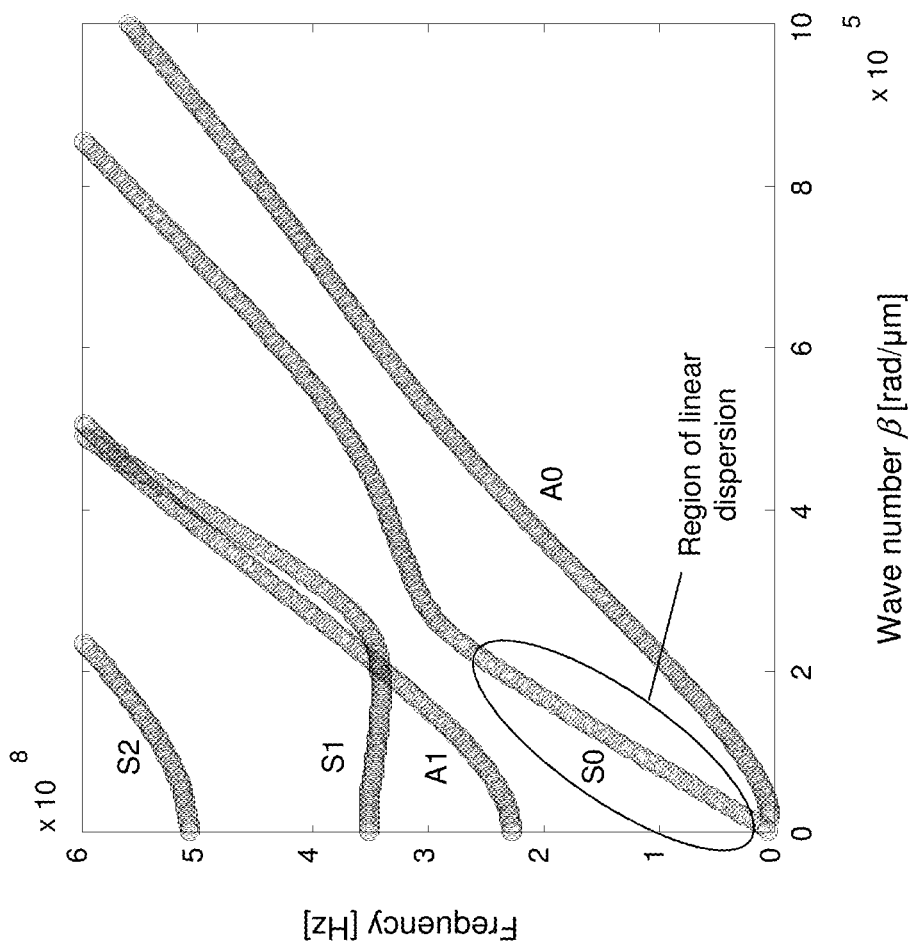
Figure 16:
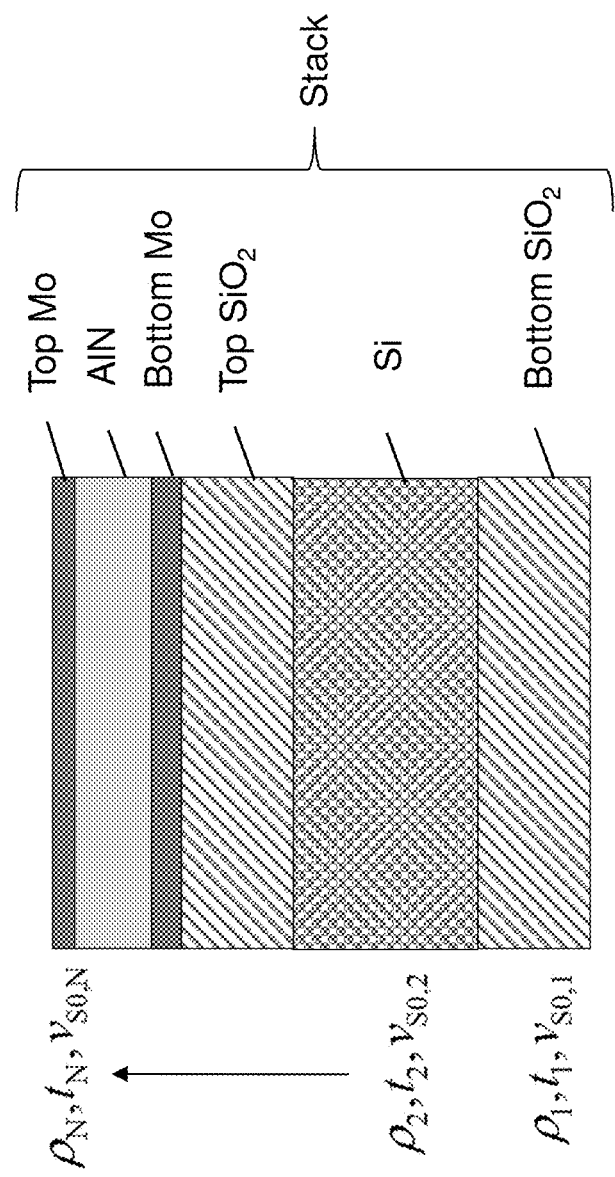
FIG. 16 depicts a mechanical resonating structure.

FIG. 11A depicts propagating non-evanescent eigenmodes for a pure AT-cut Quartz plate of a specific thickness. Other piezoelectric materials such as zinc oxide can have similar plate modes such as shown in FIG. 11A. FIG. 11B depicts propagating non-evanescent eigenmodes for a plate with a stack of materials as shown in FIG. 16 having a certain set of specific layer ratios with a specific thickness for the whole stack . FIG. 11A provides a rich illustration of plate modes of operation such as, for example, Sx (symmetric Lamb) modes, Ax (antisymmetric Lamb) modes, and SHx (shear horizontal plate) modes. It should be noted that other stack configurations of a mechanical resonating structure can result in other positions and curvature shapes of the plate modes dispersion as shown in FIGS. 11A-11B. These other stack configurations are contemplated by the present disclosure. Accordingly, FIGS. 11A-11B are considered illustrative and non-limiting.

Figure 12:
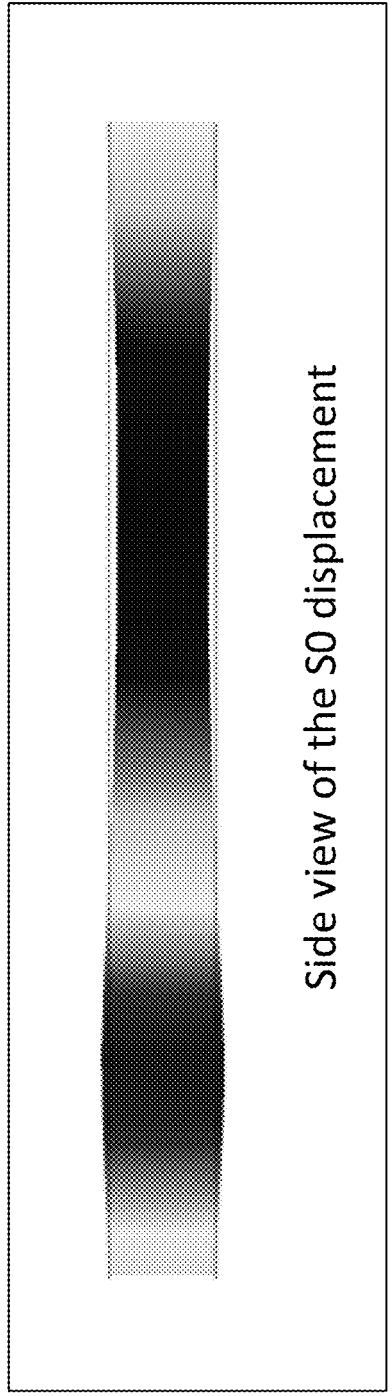
FIGS. 12-13 illustrate mode shapes of operation for a mechanical resonating structure.

In one embodiment, the mechanical resonating structure of the present disclosure can be designed so that its resonance mode of operation is influenced more by a lateral rather than a thickness displacement of the mechanical resonating structure. This mode of operation is depicted in FIGS. 11A-11B as an "S0" mode of operation. The S0 mode in the region depicted in FIGS. 11A-11B shows linear dispersion. This means that the ratio of frequency over lateral wavenumber $f/\beta$ is constant, thereby the group velocity $v_g$ is equal to the phase velocity $v_p$. In the region of linear dispersion of the S0 mode (see FIG. 11B), the resonance frequency f0 is generally insensitive to the thickness of the plate (or stack) of the mechanical resonating structure. This result can be reasoned if one looks at the shape of the S0 mode, which is basically a plate pressure wave in a lateral direction with a Poisson effect in a thickness direction. Stated another way, in the S0 mode of operation, the mechanical resonating structure resonates primarily in a lateral x and/or y direction (see FIG. 12) than in a z (thickness) direction.

Figure 13:
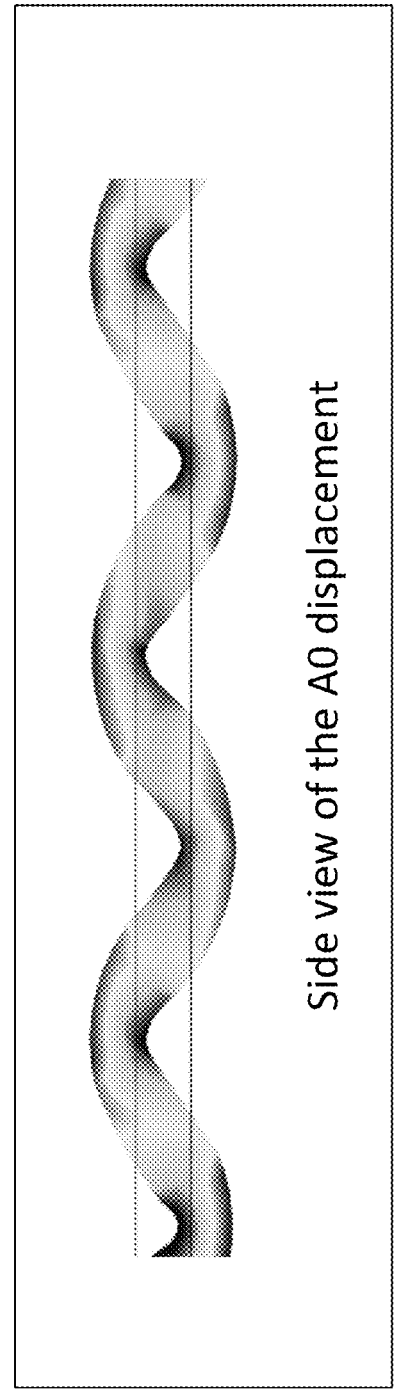

A conductor configuration formed on the mechanical resonating structure can influence whether the resonator operates in the S0 mode, the A0 mode or both. Utilizing an IDT electrode configuration such as IDT electrodes 202 shown in FIGS. 1, 8 and 14 can cause the mechanical resonating structure to operate mostly in the S0 mode. An IDT electrode configuration can among other things cause an electric field that is primarily orthogonal to the lateral directions (see references 1402, 1402) which by means of the piezoelectric effects causes normal stresses in the thickness and lateral directions. A placement of conductors such as shown in FIG. 15 where the electric fields are no longer orthogonal to the lateral dimensions to excite shear stresses (see references 1502 and 1504) can cause the mechanical resonating structure to operate in the A0 mode—see FIG. 13. It should be noted that the above descriptions may be an over simplification of how an S0 or A0 mode mechanical resonating structure can be designed. Other factors for designing the mode of a mechanical resonating structure may be required and are therefore contemplated by the present disclosure.

For the illustrations that follow, it will be assumed that the mechanical resonating structure operates substantially as an S0 mode resonator. However, it is contemplated by the present disclosure that other modes of operation of the mechanical resonating structure illustrated in FIG. 11A may be used. These other modes may include without limitation SH0-SH2, A0-A1, S1-S2, and other modes not denoted by the illustrations of FIGS. 11A-11B, which may result from other stack configurations and at higher frequency thickness products.

The subject disclosure further describes embodiments for using micro- and nano-mechanical resonators such as those described above as a sensing element for detecting ultra small magnetic fields in the nanotesla range. Using the high 100-MHz range resonance frequency of the resonator, the device detects ultra small magnetic fields by the correspondingly high induced-electromotive force (emf). Furthermore, using a microfabricated ferromagnetic core inside the resonator, the magnetic flux can be focused into a micron-sized area and the signal size can be enhanced.

The subject disclosure can be used in the development of ultrasensitive magnetometry on micron scale by combining cutting-edge nano- and micro-mechanical resonators operating at ~100 MHz and approaches for flux induction on micron scales. The subject disclosure demonstrates that the entire system, comprising of micron-sized resonators, can have nanotesla sensitivity without requiring large-sized setups or low temperature conditions required by superconductivity techniques, or atomic/optical conditions required by atomic magnetometers. Furthermore, this semiconductor approach enables integration of an array of such micron-sized sensors for local field mapping in room temperature conditions. The device technology discussed in the subject disclosure can be applied to condensed matter physics, biological field mapping, geological field detection and other field solutions.

Ultrasensitive detection of weak magnetic field is of fundamental and technical interest. Magnetic fields produced by the electrons or by the coupling of spin and orbital degrees of freedom can be used to study spin manipulation and processing for spintronics. Recent developments in sensitivity of atomic or optical magnetometer techniques are beginning to benefit traditional applications in fundamental physics by exploring violations of fundamental symmetry. Measurement of weak magnetic fields on micron-scale resolution can be fundamentally important for materials studies such as scanning magnetic microscopy and quantum information processing. Room-temperature techniques of the subject disclosure can benefit traditional research areas and enable new studies, accessible previously only by low temperature SQUID (Superconducting Interference Device) techniques or optical/atomic systems.

For biomedical applications, non-invasive diagnostics are especially desirable when it comes to the human body. Currently, SQUID magnetometers are used for neuroimaging and cardio magnetism. Both SQUID-based techniques and atomic magnetometers based on the interaction of resonant laser light and atomic vapor demonstrate picotesla sensitivities. However, they are difficult to integrate and employ as a scanning system for biomedical magnetic mapping of the brain and the heart. The device of the subject disclosure can be used for these applications without the fundamental limitations of size, cost or integration.

Ultrasensitive detection of weak magnetic field is of fundamental and technical interest. Detection of ultra small magnetic fields with high sensitivity is used in a wide range of subjects: from fundamental material science and studies of planetary sciences and solar evolution to inertial navigation and biomedical applications in mapping small currents, and hence magnetic fields, in human hearts. Depending on applications, magnetic field detection sensitivity can vary from millitesla to femtotesla ($10^{-15}$ tesla).

More importantly, miniaturized magnetic field sensors or magnetometers with microtesla sensitivity have been recently used in numerous consumer electronics devices such as cellular phones, gaming devices and handheld navigation units. Because of the convergence of electronic and consumer applications, the need for miniaturized magnetometers with small footprint is becoming more and more urgent.

In one embodiment, subject disclosure presents a silicon-based chip-scale MEMS (Micro-Electro-Mechanical Systems) magnetometer with small footprint (1.2 mm×1.2 mm×0.9 mm) and low cost for use in handheld devices. In one embodiment, the subject disclosure also describes a single-axis MEMS magnetometer with sub-microtesla sensitivity.

Building upon the application of compassing for navigation, most modem navigation systems use a magnetometer to determine the heading direction. With an interface to the electronic navigation system, magnetometers are used for automobile GPS systems and electronic compassing for cars. Recently, magnetometers are used in GPS-denied environments for dead reckoning navigation and position estimates. In particular, modules with three-axis magnetometers, accelerometers and gyroscopes (along with a barometric altimeter) can keep track of user movement when GPS derived location become unavailable or degraded. A low cost chip-scale magnetometer with high accuracy (sub-microtesla sensitivity or <0.05 degree resolution) can provide an integrated solution to the problem of navigation by handheld devices in GPS-denied environments. More importantly, what is desired is a silicon-based solution so that the device can be integrated with other devices either within a chip-scale package or in a multi-chip module. Current Hall sensor-based solutions do not provide that option, which ultimately limits the widespread use of the magnetometers in cellular phones and other handheld devices. The subject disclosure eliminates this limitation.

For biomedical applications, non-invasive diagnostics is especially desirable when it comes to the human body. Currently, SQUID magnetometers are used for neuroimaging and cardio magnetism since the biological fields produced by the human body are typically in the sub picotesla range, which is accessible only by SQUIDs. In addition to high sensitivity, these sensors are required to possess good spatial resolution.

So far, only SQUIDs fulfill all technical requirements to map the magnetic field of brain activity or the human heart beating. SQUID-based techniques are now standard, although the operation of SQUID-based systems require low temperature conditions for superconductivity, and the measurement set-ups tend to be rather large, expensive and not portable. Recent advances in atomic magnetometers based on the interaction of resonant laser light and atomic vapor demonstrate sub-picotesla sensitivities. However, they are difficult to integrate and employ as a scanning system for biomedical magnetic mapping of the brain and the heart. None of these approaches with ultra high sensitivity can be used in consumer electronics or in handheld devices.

Existing sensor technologies have significant noise-size-power-cost trade-off limitationst: low-noise is obtained at the expense of size, power and/or cost. The subject disclosure describes the magnetic field detection sensitivity in terms of microtesla instead of degrees, which is the standard approach in applications. Since magnetic field strengths vary from location to location, it is more useful to define sensitivity in terms of microtesla than angular resolution in detecting magnetic field direction. The subject disclosure provides some of the base numbers for angular resolution below.

Current low noise sensor technologies broadly fall into three categories: (i) low temperature SQUID, (ii) optical and (iii) novel material-based. Both SQUID and optical devices are large and require significant power due to their need for low temperatures or picosecond lasers. Certain novel material based techniques provide a better combination of noise, size and power, but suffer from the issue of manufacturability and reliability, hence high cost. Other sensor technologies capable of operating in the micro-tesla ranges cannot be scaled to increase the sensitivity and the dynamic range for the nanotesla and picotesla applications.

The subject disclosure is based on micromechanical resonators such as the resonators described above to produce a magnetometer device with performance unachievable at room temperatures by other technologies and compatible with high yield fabrication techniques.

The subject disclosure describes a three-dimensionally suspended Hybrid Micromechanical Resonator-based Induction-Coil Magnetometer (HyMRIM). The micromechanical resonator is designed to have extremely high resonance frequency in the range of 10 MHz-1 GHz. An integrated induction coil is microfabricated on top of the device in either single loop or multiple loop configurations. Furthermore, a ferromagnetic core can be placed for concentrating the flux into the loop. The device output can be a narrowband signal at the resonance frequency modulated by the low frequency (e.g. 1-100 Hz) objective signal, which is obtained by demodulating the carrier signal.

The HyMRIM device can approach (1) 1.2 mm×1.2 mm×0 9 mm or less in size, (2) sub-microtesla sensitivity, (3) operating at room temperature, and (4) fabricated by standard semiconductor manufacturing process.

The HyMRIM's key can be used in sensitive applications by scaling it to micron-sizes similar to those used in electric field "field mills" or magnetic fluxgate devices, and coherently combining outputs of many micro-scaled devices into a single sensor output. This results in orders of magnitude enhancements in the sensor signal generated per unit area of the sensor device, and enables achieving sub-nT noise floor from overall small and low power sensors.

An embodiment of the subject disclosure can be based on a small induction coil oscillating at high resonant frequency. Coil oscillations modulate its area and cause the magnetic flux through the coil to fluctuate at the same frequency as coil oscillations. Thus the output signal is proportional to the coil size and the frequency of oscillation. Decreasing coil size allows increasing its resonance frequency so that the signal output does not decrease. At the same time, decreasing the length of the coil wire leads to the reduction of wire resistance and thus reduction of device self-noise. This embodiment enables low noise floor from a micron scale device.

Towards ultimate sensitivity for high-end applications, an embodiment of the subject disclosure can make use of the combination of outputs from many micro-scale devices. Since a device noise floor stays about the same as the device size decreases and larger number of smaller devices can be "packed" into the same available area, overall sensor noise floor decreases with decreasing feature size. Thus embodiments of the subject disclosure enable small sensor size with extremely low noise floor.

The subject disclosure can be based on modulating high frequency (100's MHz) with the low frequency signal of interest, amplification of the high frequency signal, and subsequent demodulation to recover the low frequency signal of interest. Thus embodiments of the subject disclosure can be insensitive to 1/F noise and provides excellent performance down to DC frequency.

Device power draw can be dominated by the power required by a low noise amplifier necessary to amplify signals from individual devices. Embodiments of the subject disclosure can coherently combine many devices before amplification. This enables using an amplifier with a higher noise floor, and/or to use only one amplifier per sensor. Thus, embodiments of the subject disclosure provide for low power sensing. Embodiments of the subject disclosure can be readily manufactured, at high yield, using standard wafer manufacturing techniques, providing small low power sensors with even SQUID-like or better noise floor in a short-term program.

In comparison, the MEMS-based techniques (either as Lorentz force/Faraday EMF sensors or the magnetic resonance force sensors) typically operate at low frequencies (kHz-MHz). Though an approach of the subject disclosure is similar to the Lorentz-Force/Faraday-EMF approach, because of orders of magnitude increase in frequency, embodiments of the subject disclosure can obtain orders of magnitude enhancement in sensitivity. Furthermore, addition of a ferromagnetic core to enhance the flux focusing (typically by a factor of 100 or higher, defined by the demagnetization factor), embodiments of the subject disclosure obtain an additional 1-2 orders of magnitude enhancement.

For medical diagnostics and research, mapping at the nano- and pico-tesla range has been used for the detection of biological magnetic fields from the brain and the heart. Magnetoencephalography (MEG) is a noninvasive technique that measures the magnetic fields generated by neuronal activity of the brain. The spatial distributions of the magnetic fields are analyzed to localize the sources of the activity within the brain, and to provide information about both the structure and function of the brain. Similarly, Magnetocardiography (MCG) is a noninvasive technique that measures the magnetic fields produced by electrical activity in the heart. A spatial distribution or map of the magnetic field over the chest can be used in conjunction with mathematical models to locate the source of abnormal rhythms or cardiac arrhythmia and other heart diseases. Low cost chip-scale ultrasensitive magnetometers with small footprints can be used for MEG and MCG with higher spatial resolution.

Magnetometers are widely used in geology to map earth's magnetic field. Ferromagnetic compounds, mainly iron oxide, leave a magnetic signature that can be detected, even when the source is hidden beneath other materials. Such studies have deepened an understanding of volcanic activity and tectonic plate movements. An important application is measuring the interaction of the solar wind with the earth's magnetic field. In some cases an aurora can be detected before it is visibly observable. Beyond earth, magnetometers have been sent on probes to a number of planets including Venus, Mercury and Saturn. These experiments help determine the composition of planets, such as the size of their iron core.

Commercial applications related to geology also use magnetometers extensively, in activities ranging from mining to sensors on directional drill bits, where they help determine the azimuth of the drill head. Magnetometers can also detect pipelines and underground or underwater cables. As many manmade structures contain magnetic materials these sensors have successfully been used to detect ancient buried cities and lost ships. The advantages of being able to detect buried compounds, be they natural mineral reserves or manmade structures, without expensive and destructive digging are clear.

Magnetic sensors for the detection, localization, and classification of time-critical targets are also of importance in monitoring, surveillance, intelligence, and security applications. Typically, passive detection of magnetic anomalies in the field can be used to identify the presence and the movement of vehicles or personnel carrying ferrous metal. In addition, with a spatial distribution of ground-based, all-weather, remote magnetic field sensors, it is possible to obtain the speed and the direction of travel to generate time-phased record of ground activity. Magnetic sensors are used in a variety of uniquely military applications: e.g. Magnetic Anomaly Detection (MAD) sensing for ASW, monitoring Under Ground Facilities (UGFs), and detecting UneXploded Ordinance (UXO). The use of Unattended Ground Sensors (UGSs) for UGF monitoring offers an excellent example of the need for a revolutionary advancement in magnetic sensor technology.

Magnetic field sensor technology (magnetometer) have been used in a variety settings ranging from consumer electronics such as hard drives to hospital settings in particular medical imaging. The following serves as a brief overview of previous work on magnetometers focusing on their sensitivity and possible applications. However, it is important to note that in general sensitivity depends on read-out electronics and other factors such as operation frequency and operation temperature, and possible applications are often limited by size, power consumption and cost.

Superconducting Quantum Interference Device (SQUID) are the most sensitive magnetic field sensors. They consist of a superconducting ring interrupted by a weak link, called a Josephson junction. If the weak link is small enough, cooper pairs can tunnel through the junction. The tunneling rate is sensitive to the changes in magnetic flux threading the ring. Hence, small changes down to the flux quantum can be detected. The sensitivity of the SQUID depends on the magnetic field noise, which is of the order 10 fT, However, sensitivities in the sub fT have been reported. The size of a SQUID detection setup is quite bulky, as the SQUID needs to be cooled by a low temperature liquid, typically helium. This is the reason for the high operation cost of a SQUID magnetometer.

The search coil magnetometers (SCM) exploit Faraday's law of induction. A typical SCM consists of a conducting coil with n loops and can be several inches long. When the magnetic flux through the loops changes an emf is induced and measured. The sensitivity of a SCM depends on size, rate of change in magnetic flux and the number of turns. The bandwidth of this detector is limited by the time constant, τ-L/R, of the RL-circuit that is formed by the loops of the coil, where R is the resistance of the coil while L is its inductance. Sensitivity for SCM has no upper limit and can detect magnetic fields as weak as several ff. Operating frequencies range from several Hz to the MHz range.

Fluxgate magnetometers (FM) consist of a several inches long ferromagnetic core with a drive and a detection coil wrapped around it. The FM exploits the hysteresis curves of a ferromagnetic core to detect changes in magnetic fields. The sensitivity of a FM depends on the shape of the hysteresis curve and lies between 10 pT to several mT. Its bandwidth is limited by the response time of the ferromagnetic core, which is typically below 10 kHz.

A Hall Effect magnetometer (HEM) exploits the Hall effect, by measuring the Hall voltage across a semiconductor threaded by an external magnetic field. The sensitivity of the sensor depends heavily on the electron mobility of the semiconductor being used. For example, the sensitivity of a silicon HEM ranges from mT-T, while the sensitivity of an Indium-antimonite HEM can be as low as 100 nT. The bandwidth of HEMs typically ranges from DC -1 MHz and the power consumption is of the order of 0.1 W. HEMs are light, cheap and occupy about 0.1 in$^2$ each.

To measure an external magnetic field with a nuclear precession magnetometer, protons are aligned by a drive magnetic field in a certain direction. When this magnetic field is turned off, so that the protons begin to precess around the direction of the external magnetic field. These moving charges in return induce a signal in a coil around the protons at the precession frequency. This frequency is proportional to the magnitude of the magnetic field. The sensitivity in detecting magnetic fields this way is of the order of nT. This sensor is bulky, expensive and has high power consumption.

Giant/Anisotropic Magnetoresistance Magnetometers (GMRM/AMRM) measure a change in resistance versus the magnetic field. AMRM are usually made out of a metallic alloy, most commonly perm alloy. The sensitivity of AMRM depends heavily on the read out and feedback circuit, and one has to trade bandwidth for sensitivity. If one needs a sensor with a high bandwidth (1 GHz) then the sensitivity is limited to μT-mT. GMR magnetometers are similar to AMRMs in that they are small, cheap, light and measure the change in resistance versus the magnetic field.

Fiber-optic magnetometers (FOM) typically consist of 2 fiber optic cables (one coated with magnetoresistive material) each about 4 in long and 1 in wide. An optical signal is then split and passed through the two cables and then recombined at the other side of the sensor. Due to the magnetoresitive coating on one cable one effectively measures a length difference between the two cables, proportional to the external magnetic field, which can thus be measured with great accuracy. Sensitivity ranges from pT-mT. The bandwidth of a typical FOM is from DC-<60 kHz.

Magneto-Optical Magnetometer (MOM) devices again exploit Faraday's law, which also states that polarization of polarized light traveling through magnetic material rotates depending on the external magnetic field. This rotated polarization can be detected and the corresponding external field then be deducted. This sensor has a bandwidth of up to 1 GHz and allows detection of magnetic fields as weak as 30 pT, however the sensor is quite large, expensive and has high power consumption.

MEMS Magnetometers, different from the embodiments described in the subject disclosure, exploit a resonating miniature magnet that in the presence of a magnetic field changes its resonance frequency due to the extra force introduced to the system. The maximum sensitivity of these sensors is of the order of μT. These MEMS magnetometers are bulky, power hungry and non-integrable in contrast to embodiments of magnetometers in the subject disclosure.

Optical Pump Magnetometer (OPM) sensors exploit transitions of electrons in Cesium vapor. Electrons are optically pumped into states that can no longer absorb light. If a magnetic field at the right frequency is then introduced to the system the pumped electrons can jump to a different state and start absorbing light again. This resonance frequency is rather sharp and shifts if an external magnetic field is applied. The sensitivity of an OPM ranges from pT-mT. The setup of this sensor is large, expensive and has high power consumption.

Spin Exchange Relaxation Free (SERF) Atomic Optical Magnetometers employ the interaction between resonant light and an atomic vapor. It is capable of SQUID-like sensitivities and mm-range scanning resolution, though the size and the cost of setup (requiring lasers and optical components) can be extremely expensive for practical applications.

A comparison of multiple technologies based on achievable sensitivity, robustness, cost, manufacturability, and inherent limitations are shown in FIG. 21. The benefits of a micromechanical approach include low sensitivity, superior robustness, small size, low cost, and high yield fabrication potential.

A device illustrating an embodiment of the subject disclosure is a directional magnetic field sensor. Output signal is produced by a micro-scale coil moving through the magnetic field. The coil is attached to a micro-scale mechanical resonator so coil oscillatory motion is excited by the resonator oscillations. The resonator is driven by a piezoelectric transducer at resonant frequency $f_0$, which is typically in the range of 10-100 MHz, depending on the resonator size. The resonator mounted coil moves perpendicular to the magnetic field (see table C1 for various design possibilities). The motion changes magnetic flux through the coil and thus induces electric current in the coil.

In a static magnetic field, the output signal is a tone at the excitation frequency $f_0$, with magnitude proportional to the field strength and to the frequency of the coil oscillations. The high frequency coil oscillations provides a high output signal level and effectively translates (modulates) the spectrum of the magnetic field from low frequency to the high frequency $f_0$. This modulated high frequency signal is amplified and then base-banded to derive the original magnetic signal. This procedure (similar to that used by magnetic fluxgates or electric "field mill" sensors) allows mitigating or even completely avoiding 1/f noise because prior to the measurement it effectively translates the low frequency magnetic field from low frequency (where 1/f noise is high) to MHz range frequency (where 1/f noise is not important).

The induced emf in the integrated coil can be given by $$V_{emf} = -n\frac{d\varphi}{dt} = -n\frac{d(A \cdot \mu_0 H)}{dt}, \qquad (C4.1)$$

where n is the number of turns and φ is the flux enclosed by the loop. With a ferromagnetic core, the expression is modified as $V_{emf} = -n\mu_0\mu_{ap}(d(A.H)/dt)$, where $\mu_{ap}$ is apparent permeability of the core. The resonator can be driven at a fundamental resonance frequency to excite a first mode. For small amplitude oscillations, first mode shape is such that the area enclosed by the flux is given by Lz, where L is the length of the coil and z is the displacement in the direction perpendicular to the flux. Ignoring fringe and other edge effects, the induced emf is $V_{emf} \approx -n\mu_0\mu_{ap}H(Lz)\omega_0$, where $V_{emf}$ is rms voltage of the signal, and z is the rms displacement. Using currently achieved parameters (see FIG. 22), the expected noise floor with available preamplifier is about 100 pT/rtHz, limited by amplifier and Johnson noise (see the section below on noise analysis).

As seen from the equation C4.1, the signal is enhanced by using multiple turn coil, ferromagnetic core, by employing a high Q resonator, and by using high excitation frequency $\omega_0 = 2\pi f_0$.

- Single turn coil is currently used, but is expected that 3 to 10 turn coil can be manufactured using standard manufacturing techniques.
- Apparent permeability for high μ material core depends mostly on the core and coil geometry: $\mu_{ap} \approx r_c^2/(\ln(2r_c)-1)$, where $r_c = L/D$ is the aspect ratio of core and coil (longer is better), L is the coil length, and D is coil width. Current coil aspect ratio is about 3, so if using a permeable core, it is expected $\mu_{ap} \approx 11$. It is expected that a core with order of 10 in aspect ratio will be feasible, providing apparent permeability up to $\mu_{ap} \approx 50$.
- Currently achieved Q is just under 3000. It is expected that by reduction of clamping loss and material induced loss Q can be increased to about 10,000 for torsional or transverse modes and even higher for breathing modes
- Currently achieved excitation frequency $f_0$ is about 10 MHz. It is expected that up to 125 MHz frequency is possible.

The device noise floor can be estimated using Equation C4.2 (see below for details):

$$B_N \approx \frac{V_N}{n\mu_{ap}(Lz)\omega_0}, \quad (C4.2)$$

where $B_N$ is the magnetic noise Power Spectral Density (PSD), $V_N$ is noise PSD (combined noise on the sensor output and amplifier input noise), n is number of turns in the coil, $\mu_{ap}$ is an effective increase in magnetic permeability if a ferromagnetic core is used to increase sensor output, L is the width of the resonator, z is the rms displacement of the coil motion, Q is the quality factor of the resonator, and $\omega_0$ is the frequency of the coil motion. Nanostructures built to date are expected to achieve on the order of pT/rtHz noise floor (see FIG. 23 below). Since an approach of embodiments of the subject disclosure can be insensitive to 1/f noise, this noise floor can be achieved at 1 Hz and below.

For increased sensitivity, coherent combination of multiple resonators will be needed, requiring them to move synchronously (in phase). The phase of resonator motion depends on the phase of the excitation voltage driving the resonators. To achieve in-phase motion for all resonators will require careful control of mechanical tolerances (to achieve similar resonance frequencies) and electrical phase tolerances in the drive circuits.

FIG. 23 summarizes current achievements of embodiments of the subject disclosure, range of parameters that embodiments of the subject disclosure are expected to achieve for the objective sensor, expected improvement (in dB) of objective sensor noise relative to the current room-temperature state-of-the-art (SOA), and the expected noise floor of both state-of-the-art sensor (about 100 nT/rtHz) and the objective sensor (from few nT/rtHz to fractions of nT/rtHz). Note that amplifier noise floor (1 nV/rtHz) is limiting performance of the current system.

The subject disclosure can involve the following steps. Note that the following description represents detailed analysis of the device as well as the development of the fabrication process: (i) Design and Characterization of Device by Finite-Element Simulation, (ii) Choice of Materials, (iii) Device Fabrication and Characterization, (iv) Magnetic Field Measurement Technique, (v) Noise and Sensitivity Considerations.

Using finite element analysis software tools such as COMSOL and ANSYS the optimal resonator geometry and type can be determined. This step can be used to choose which technique, flexural mode, torsional mode or breathing mode is most effective. It can also help narrow down the device parameters such as the overall size. Initial measurements can identify each of the high amplitude modes found in finite-element simulation.

A number of considerations come into the choice of materials for a device of the subject disclosure. (i) signal size, (ii) compatibility with the MEMS etching techniques, (iii) piezo electric material considerations. Most commonly Aluminum Nitride (AlN) is used as a piezoelectric material in MEMS structures. Thin films of AlN are commercially available with preexisting bottom electrodes making it ideal to use as a piezoelectric starting material. The ideal core material must still be determined, most likely an iron compound. Good candidates are Mu-Metals (75% nickel, 15% iron) or Permalloy (80% nickel, 20% iron). To achieve optimal permeability, annealing in hydrogen may be required.

The approach for resonator fabrication can consist of standard lithography process. The subject disclosure can use other suitable fabrication processes.

Piezoelectric materials have the ability to generate an electric potential when a mechanical stress is applied to the material. Conversely, they have the ability to deform when an electric potential is applied. It is the latter that is exploited to actuate mechanical motion in a resonator and the former to sense this motion. Embodiments of the subject disclosure can use piezoelectric actuation and detection technique to drive and characterize the resonator.

An oscillating coil immersed in a magnetic field can induce an emf in the detection electrode:

$$V_{emf} = -n\frac{d\varphi}{dt} = -n\frac{d(A \cdot \mu_0 H)}{dt}$$

An average emf can be obtained by integrating the response along the length of the moving electrodes, which define the area swept though by the electrode $A = \chi L B z_{rms}$. The constant $\chi$ can be explicitly calculated for a given structure actuated mode. A lock-in amplifier can be synchronized to the actuation frequency and thus detect only the relevant contributions from the induced emf. Z is given by the beam displacement and takes the form:

$$z(\omega) = \frac{1}{\omega_0^2 - \omega^2 + i\gamma\omega}\frac{F_0}{m}.$$

The Lorentzian line shape is a generic form for a damped harmonic oscillator, centered at the (natural) resonance frequency of the mode, $\omega_0 = \sqrt{k/m}$. Here it is assumed that the force is uniform along the structure, depending how the electrodes are places for piezoelectric actuation this may not be the case, however the Lorentzian response is generally maintained. The maximum response is at this central frequency, and it is inversely proportional to the damping coefficient γ.

The quality factor Q is defined as $Q = \omega_0/\gamma$. Hence on resonance the amplitude is given by $$|z(\omega_0)| = \frac{QF_0}{\omega_0^2 m} = \frac{QF_0}{k_{\mathit{eff}}}$$

Therefore, $F_0$ is determined from the piezoelectric driving. Parameters such as the effective spring constant $k_{\mathit{eff}}$ can be calibrated by measuring the device in the presence of a known magnetic field. Solving for the magnetic field one finally obtains the expression:

$$B \approx \frac{V_{\mathit{emf}}}{n\mu_{ap}(Lz)\omega_0}$$

Ultimately the sensitivity of the device can be given by both the response strength and coupling strength of the mechanical mode to the magnetic field, as well as the noise levels present in the device. The noise levels can be split into two categories (A) Electrical noise of the readout circuit and (B) the mechanical noise in the device. Here the subject disclosure addresses the most common noise sources to ascertain the resulting sensitivity of the magnetometer.

At a finite temperature electronic noise is generated over a resistor due to the thermal motion of the charge carriers, in this case the electrons, in the readout circuit. This noise source is frequency independent, i.e. white noise. The voltage noise is temperature and resistance dependant:

$$\frac{\delta v_{\mathit{Johnson}}}{\sqrt{\mathit{Hz}}} = \sqrt{4k_B TR}$$

Shot noise arises due to the discrete nature of the electrons moving through the device. If the current level is low, $eV \ll k_B T$, then Johnson noise dominates over shot noise. In the opposite limit, $$\frac{\delta v_{\mathit{Shot}}}{\sqrt{\mathit{Hz}}} = \sqrt{2eIR^2}$$

Here, e is the electronic charge, l is the bias current and R is the resistance of the readout circuit. A proper calculation in the case of diffusive transport gives an additional numerical factor of order 1.

Often the noise limitation comes from the first-stage preamplifier. The voltage noise adds to the signal, limiting the minimum detectable magnetic field possible. As the piezoelectric drive circuit is separated from the detection loop, one is limited only by the voltage noise of the first-stage preamplifier connected to the readout circuit. In order to minimize the noise, the preamplifier must be optimized to the device parameters. The typical voltage noise in an amplifier is on the order of 1 nV/$\sqrt{\mathit{Hz}}$.

As mentioned above any electrical circuit at finite temperature is plagued by Johnson noise. Of course this is also true for the drive circuit. For piezoelectric actuation the typical voltages required are on the order of 1 mV, resulting in actuation amplitudes of 10 pm (breathing modes) to 100 nm (transverse modes). The Johnson noise in the drive circuit is estimated to contribute no more than 3 nV. As this is over 4 orders of magnitude lower than the drive voltage the resulting excitation is also four orders of magnitude below the oscillation amplitude, and it hence will be negligible.

Thermal Johnson noise at temperature T is obtained in general through the Planck distribution function. At high temperatures and low frequencies ($\hbar\omega \ll k_B T$) the energy in the mechanical oscillator is given by the thermal energy $k_B T$. The resulting displacement on resonance is given by $$\frac{\delta z_{\mathit{Thermal}}}{\sqrt{\mathit{Hz}}} = \sqrt{\frac{4kBTQ}{m_{\mathit{eff}}\omega_0^3}}$$

Even at relatively low pressures there may still be considerable collisions between the gas atoms and the resonating structure due to momentum and energy transfer from the gas atoms. Assuming a constant rate and assuming all collisions contribute equally, independent of collision location the displacement noise for a beam resonator takes the form $$\frac{\delta z_{\mathit{Gas}}}{\sqrt{\mathit{Hz}}} = \sqrt{\frac{m_{\mathit{Gas}} v P A Q^2}{k_{\mathit{eff}}^2}}$$

Where $m_{\mathit{gas}}$ is the mass of the gas atoms, v the atom velocity given by $v = \sqrt{3k_B T/m}$, P the gas pressure, A the effective area and $k_{\mathit{eff}}$ the effective spring constant. (The above analysis can be true for a beam resonator.)

Using the previously derived expression for the magnetic field, $$B = \frac{V_{\mathit{emf}}}{\xi n \mu_{ap} L z Q \omega_0} = \frac{V_{\mathit{emf}}}{\zeta z},$$

the subject disclosure presents how the voltage and displacement noise sources affect the sensitivity and precision of the magnetometer. Using standard error propagation methods one can write:

$$\delta B = \left(\sum_i \left(\frac{\delta v_i}{\zeta z}\right)^2 + \sum_i \left(\frac{V \delta z_i}{\zeta z^2}\right)^2\right)^{1/2},$$

where the first summation includes all the electrical voltage noise contributions and the second summation includes al mechanical displacement noise contributions.

At higher frequencies, magnetic core losses may dominate over coil resistance losses. There are two main contributions: hysteretic loss, proportional to frequency f and inductance, and Eddy current losses, proportional to $f^2$, conductivity, permeability and volume. The hysteretic loss arises from the core, where once fully magnetized the process is not reversible. Power is needed to reverse the field in the core at a rate f and is proportional to the magnetic field B as well and hence strongly suppressed for fields measurable according to the subject disclosure. This loss is greater for higher $\mu_r$ values and will extract energy from the oscillator, reducing the excitation amplitude. Essentially this will look like a reduction in the quality factor Q. Assuming the energy lost is given by $P_{\mathit{loss}} = K_h f B^{1.6}$ the corresponding quality factor for hysteretic losses in the presence of a InT field is on the order of $10^{10}$.

Hence this loss mechanism will only be detectable for fields above 50 mT.

Eddy current losses are likely significant as the skin depth around 100 MHz for typical materials is in the range of <1 micron. However, even though the power loss is proportional to f it is also proportional to $B^2$. Eddy current losses are reduced by lamination, in the present case the core is already extremely small. For these reasons it is believed that the Eddy current losses will only have a minor effect on Q and hence device performance. Just as in the hysteretic loss case as the relation is $B^2$ and there is an interest in very small fields this loss mechanism does not contribute in the parameter space that is desirable for operation. Since introduction of the permeable core may increase noise, one can trade the benefit of the core (increased signal) vs. risk (increased noise) to arrive to the best possible objective sensor design.

Figure 24:
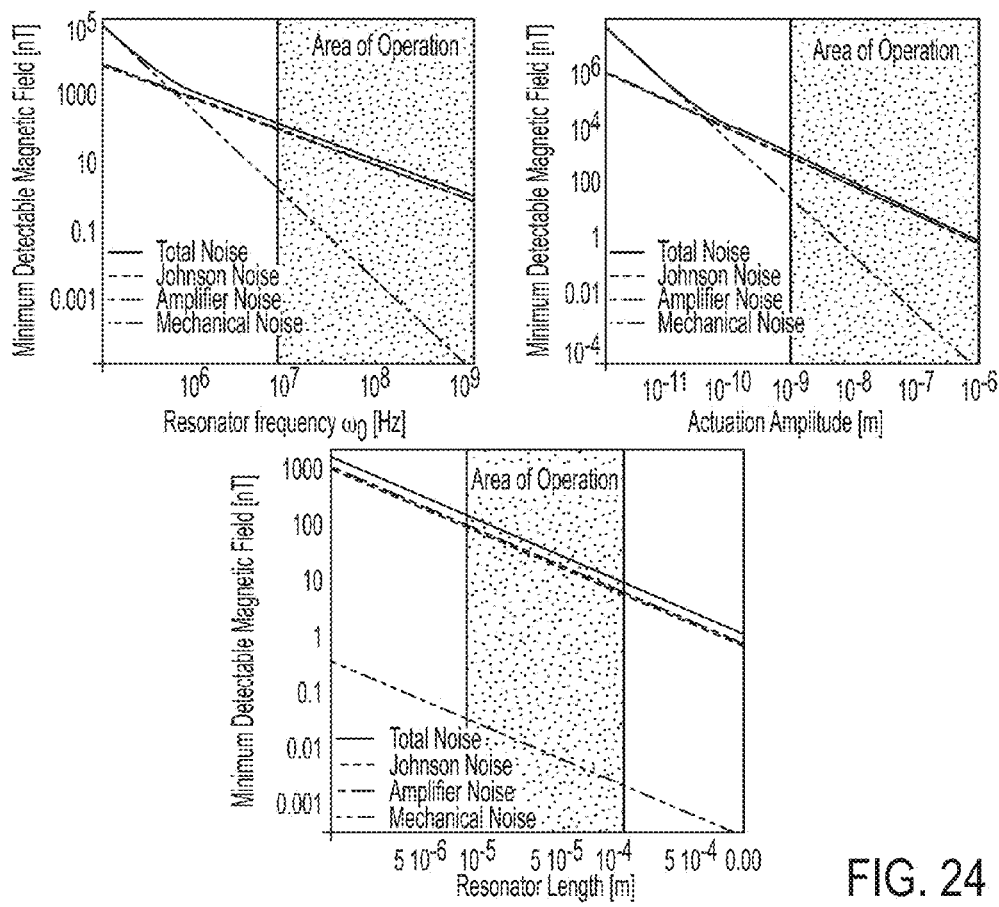
FIG. 24 depicts an illustrative embodiment of a summary of voltage and displacement noise sources. The last column displays the resulting noise level in the magnetic field measurement. The highest source of noise is clearly electrical Johnson noise, resulting in a noise floor of 10 nT.

FIG. 24 provides numerical estimates for all noise sources. (Numbers used (SI units): n=3, $\mu_0$=1, $\mu_{ap}$=100, L=$10^{-4}$ m, z=$10^{-7}$ m, Q=10 000, $\omega_0$=$10^8$ Hz, detector noise floor ($V_{min}$) $10^{-8}$V.) The largest noise contribution comes from electrical Johnson noise in the readout circuit. This results in a noise floor of 100 nT for the suggested magnetometer design.

As discussed above, there is a multitude of applications of magnetometers in a wide range of industries. The embodiments of the subject disclosure illustrate sensitive MEMS magnetometers for use in consumer electronics and navigation modules in handheld wireless devices such as cellular phones. MEMS magnetometer can be integrated with other inertial navigation devices such as MEMS accelerometer, MEMS gyroscopes and MEMS timing oscillator. In this approach, a single silicon die can contain the MEMS devices where the wafer-level cap will contain the electronic circuit IC (integrated circuit).

Figure 17:
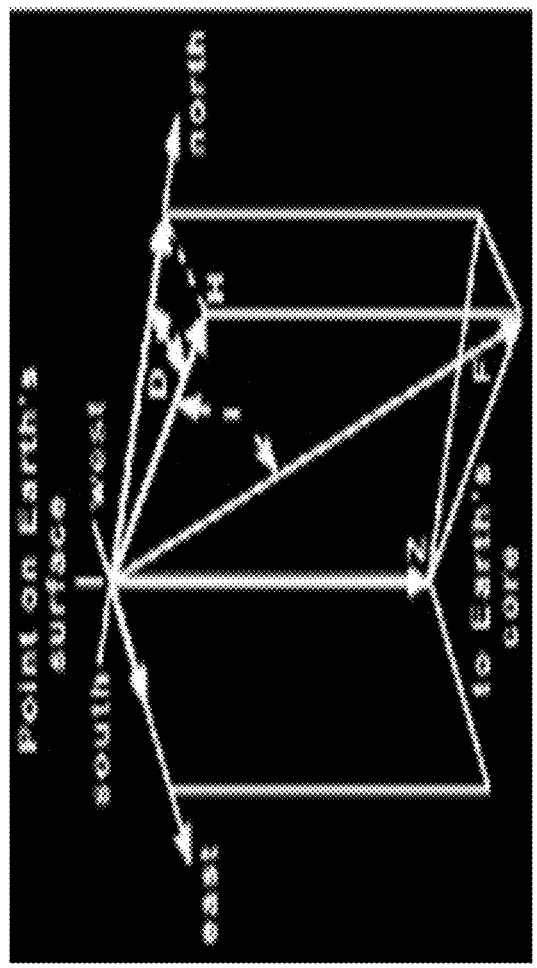
FIG. 17 depicts an illustrative embodiment of Declination (D) indicates the difference, in degrees, between the headings of true north and magnetic north. Inclination (I) is the angle, in degrees, of the magnetic field above or below horizontal. Horizontal Intensity (H) defines the horizontal component of the total field intensity. Vertical Intensity (Z) defines the vertical component of the total field intensity. (Taken from the US Government National Magnetic Field Mapping program www.nationalatlas.gov.).

In automobile navigation and avionics magnetometers can be used in a number of navigation applications for electronic compassing. Electronic compasses that use magnetometers (based on either semiconductors or MEMS) offer a number of advantages over conventional gimbaled compasses or needle-type compasses. These include shock and vibration resistance, robustness against stray-field effects, and easy interface to electronic navigation systems. Current applications include interfacing with automobile GPS systems and avionics to determine heading direction. These applications typical require resolution on the order of 0.1 degree in the magnetic field direction (defined in terms of declination and inclination in FIG. 17).

Continuous and accurate position computation is essential for vehicle navigation and other location based applications. Currently, in most portable or handheld navigation devices, position is determined using only GPS data. One of the challenges with pure GPS-based navigation is that it requires an open sky view to operate. The receiver must have direct line of sight access to multiple GPS satellites in orbit above the receiver. This greatly reduces GPS receivers' capability when used indoors, underground or in urban areas where tall buildings obscure the view of the sky. In these urban canyons, stand-alone GPS suffers from signal masking and reflections of the signal from buildings, vehicles and other reflective surfaces. This so-called multipath effect and signal fading problem is so severe that, a recent study determined, the chance of receiving four GPS satellite required for navigation can be as low as 20% of total driving time in metropolitan areas such as New York, Hong Kong and Tokyo. Strong multipath effect was also shown to contribute a positioning error of 100 m even when four or more satellites were available.

A possible solution to this problem is an integrated navigation system, which provides uninterrupted navigation data. In this integrated GPS/DR (Dead Reckoning) navigation system, GPS data is augmented with a complementary navigation system that can work in any environment. A typical DR configuration may include one gyroscope for direction measurements and a 3-axis accelerometer. In addition, a magnetometer is needed to provide heading direction. Even though these configurations are already in use in many navigation systems, the problem is still unsolved for mass market portable consumer devices such as cellular phones, since the integrated navigation system with GPS, gyroscopes and accelerometers must satisfy the basic requirement of light weight, small footprint, low power consumption and low cost. One possible solution is an integrated MEMS approach that combines a MEMS gyroscope, a MEMS accelerometer and a MEMS magnetometer for dead reckoning.

Figure 18:
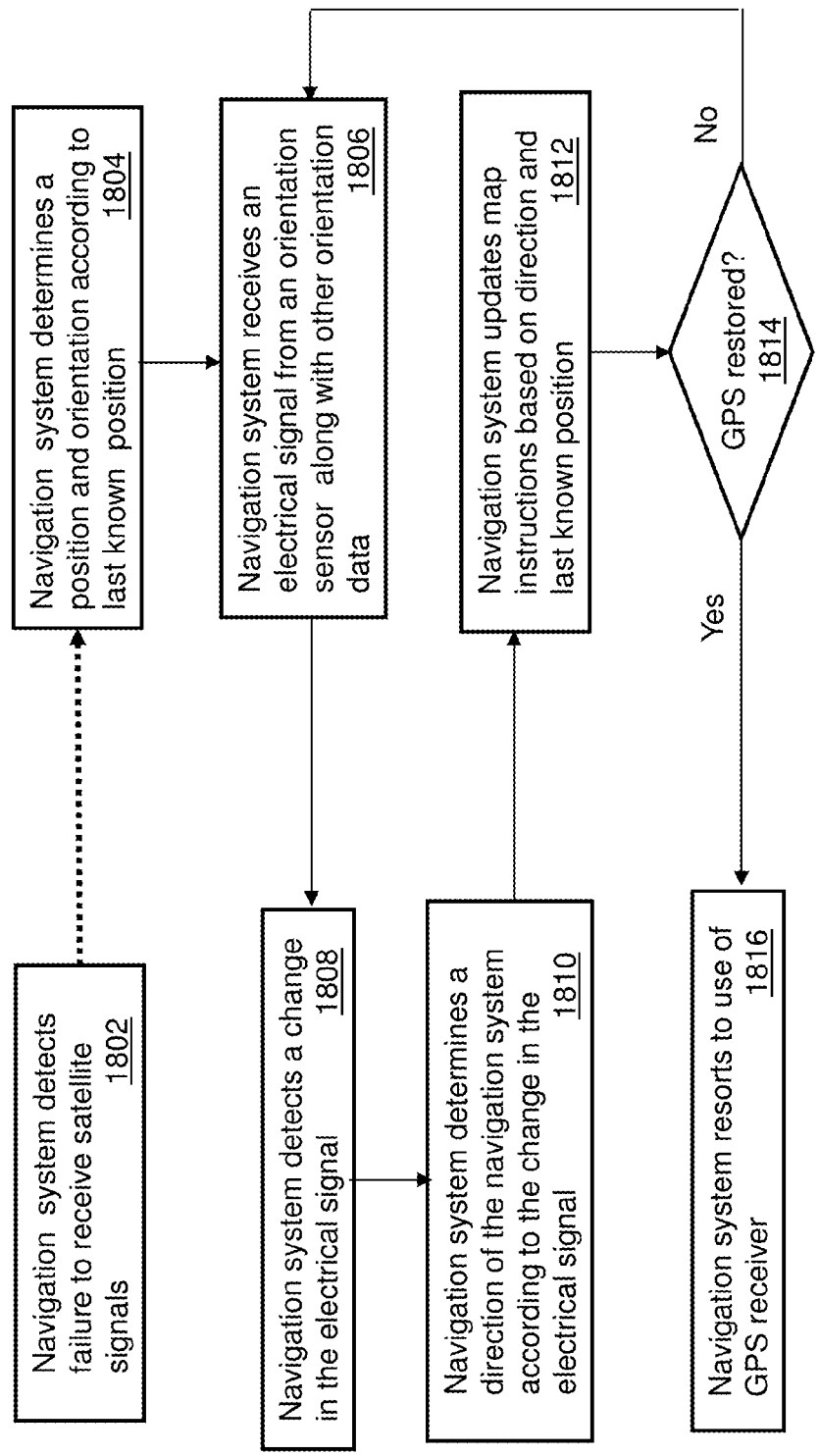
FIG. 18 depicts a method for navigating with an electromechanical magnetometer.

FIG. 18 depicts a method 1800 for navigating with an orientation sensor as described by the subject disclosure to overcome the noted limitations above. A navigation system can include an orientation sensor, a gyroscope, and accelerometer. The orientation sensor can comprise a mechanical resonator, and an induction coil coupled to the mechanical resonator for producing an electrical signal having an operating frequency proportional to a mechanical resonating frequency of the mechanical resonator and proportional to a change in a magnetic flux resulting from a change in orientation of the navigation system. The orientation sensor can also include a magnetic core, where the operating frequency of the electrical signal is proportional to the mechanical resonating frequency of the mechanical resonator and proportional to the change in the magnetic flux in the magnetic core resulting from the change in orientation of the navigation system. Embodiments of the orientation sensor have been described above.

Method 1800 can begin with the navigation system detecting at step 1802 a failure to receive GPS satellite signals. At step 1804 the navigation system can determine a position and orientation of the navigation system according to a last known location coordinate supplied by the GPS receiver and position information obtained from at least one of the gyroscope, the accelerometer, the orientation sensor, or a combination thereof. The navigation system can receive an electrical signal from the orientation sensor that is proportional to a change in a magnetic flux resulting from a change in orientation. If there is no change in the electrical signal, then the navigation system can be configured to assume there is no change in orientation. If a change in the electrical signal is detected in step 1808, a change in direction can be determined in step 1810 by the navigation system according to the change in the electrical signal and data provided by the gyroscope, accelerometer, or combination thereof. At step 1812 the navigation system can update map instructions presented to a user by audio and/or visual feedback based on the direction determined in step 1810.

At step 1814, the navigation system can monitor restoration of the GPS satellite signals. If the GPS signals cannot be received reliably (e.g., GPS satellites cannot be readily detected), then the navigation system can proceed to step 1816 where it resorts to use the GPS receiver. If the GPS signals are not available, the navigation system can repeat steps 1806-1812.

Use of magnetic field sensors in handheld devices, and in particular cellular phones, continues to grow with an unprecedented rate as the number of new features and user interfaces continues to increase. For instance, magnetic field sensors are used as non-contact switches. Flip-type cellular phones usually have a magnet on the key. As the phone is folded, a magnetic sensor detects the magnetic field, and hence turns off the screen to save battery life. Likewise, when the sensor gets away from the magnetic field as it is unfolded, the screen turns on.

Another area where magnetic sensors are being used in cellular phones and gaming devices is the analog pointing device. In contrast to a conventional curse key that can move only in 4 fundamental directions (up/down, left/right), an analog pointing device using a magnetometer can provide a cursor that can move in arbitrary directions with ease like a mouse in personal computers. There is a growing need for these analog cursors as the smart phones become equipped with full browser functions. A chip-scale MEMS device with ultra small footprint will enable and enhance most of these applications.

Upon reviewing the aforementioned embodiments, it would be evident to an artisan with ordinary skill in the art that the above embodiments of method 1100 can be modified, reduced, rearranged, or enhanced without departing from the scope and spirit of the claims described below. For example, method 1100 can be adapted so that the tuning process is applied to mechanical resonating structures that have been removed from a wafer as individual devices prior to packaging. Method 1100 can also be adapted to form one or more sacrificial layers on lateral surfaces of the mechanical resonating structures, and/or bottom surfaces of the mechanical resonating structures, each of the lateral or bottom sacrificial layers being accessible for tuning purposes.

In another embodiment, method 1100 can be adapted to add or remove materials from portions of the mechanical resonating structure to change a mass of one or more layers of materials in the mechanical resonating structure to reduce a variance in the resonant frequency of the mechanical resonating structure over a desired temperature range. Other embodiments of method 1100 are contemplated by the present disclosure.

Figure 19:
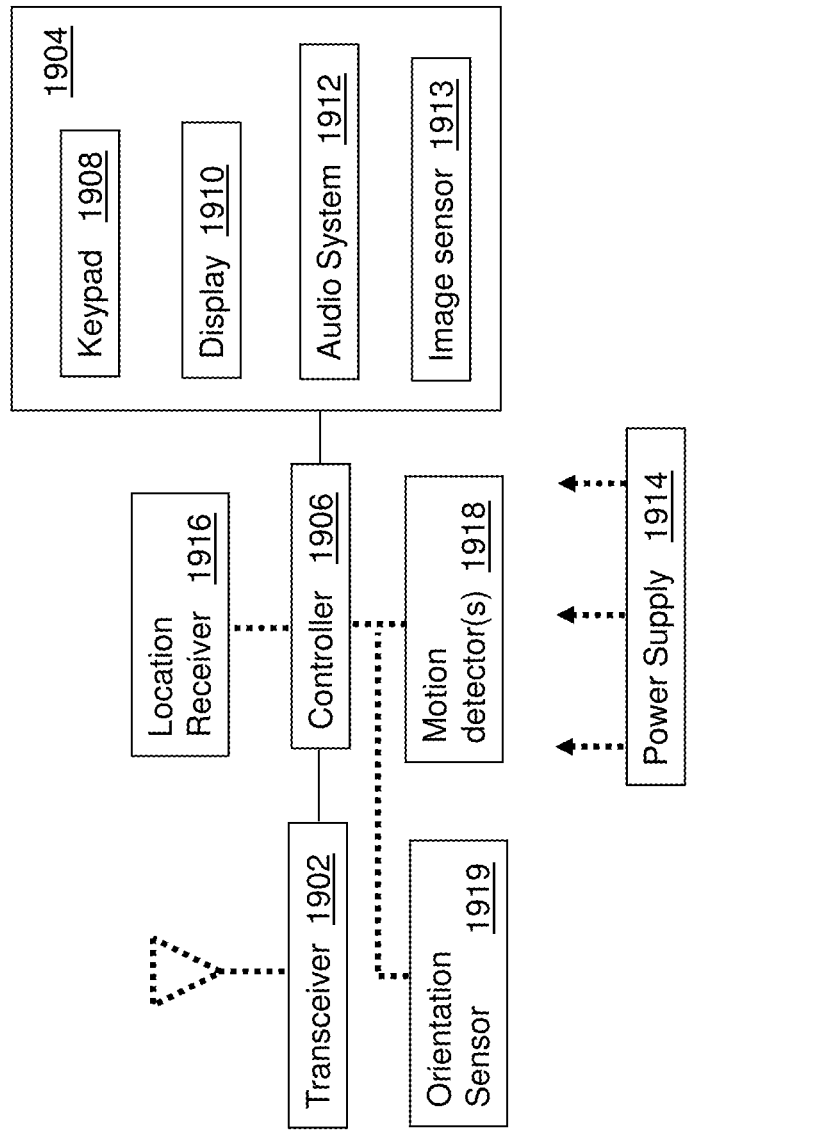
FIG. 19 depicts a computing device that can utilize one or more of the mechanical resonating structures of the present disclosure.

It should also be evident from the present disclosure that the mechanical resonating structure can be used in many applications including computing devices such as shown in FIG. 19. FIG. 19 depicts a computing device that can utilize one or more of the mechanical resonating structures as described herein. The computing device 1900 can comprise a wireline and/or wireless transceiver 1902 (herein transceiver 1902), a user interface (UI) 1904, a power supply 1914, a location receiver 1916, motion detector(s) 1918, an orientation sensor 1919, and a controller 1906 for managing operations thereof. The transceiver 1902 can support short-range or long-range wireless access technologies such as infrared, Bluetooth, WiFi, Digital Enhanced Cordless Telecommunications (DECT), or cellular communication technologies, just to mention a few. Cellular technologies can include, for example, CDMA-1X, UMTS/HSDPA, GSM/GPRS, TDMA/EDGE, EV/DO, WiMAX, SDR, LTE, as well as other next generation wireless communication technologies as they arise. The transceiver 1902 can also be adapted to support circuit-switched wireline access technologies (such as PSTN), packet-switched wireline access technologies (such as TCPIP, VoIP, etc.), and combinations thereof.

The UI 1904 can include a depressible or touch-sensitive keypad 1908 with a navigation mechanism such as a roller ball, a joystick, a mouse, or a navigation disk for manipulating operations of the computing device 1900. The keypad 1908 can be an integral part of a housing assembly of the computing device 1900 or an independent device operably coupled thereto by a tethered wireline interface (such as a USB cable) or a wireless interface supporting for example Bluetooth. The keypad 1908 can represent a numeric keypad commonly used by phones, and/or a QWERTY keypad with alphanumeric keys. The UI 1904 can further include a display 1910 such as monochrome or color LCD (Liquid Crystal Display), OLED (Organic Light Emitting Diode) or other suitable display technology for conveying images to an end user of the computing device 1900. In an embodiment where the display 1910 is touch-sensitive, a portion or all of the keypad 1908 can be presented by way of the display 1910 with navigation features.

The UI 1904 can also include an audio system 1912 that utilizes common audio technology for conveying low volume audio (such as audio heard only in the proximity of a human ear) and high volume audio (such as speakerphone for hands free operation). The audio system 1912 can further include a microphone for receiving audible signals of an end user. The audio system 1912 can also be used for voice recognition applications. The UI 1904 can further include an image sensor 1913 such as a charged coupled device (CCD) camera for capturing still or moving images.

The power supply 1914 can utilize common power management technologies such as replaceable and rechargeable batteries, supply regulation technologies, and charging system technologies for supplying energy to the components of the computing device 1900 to facilitate long-range or short-range portable applications. The location receiver 1916 can utilize common location technology such as a global positioning system (GPS) receiver capable of assisted GPS for identifying a location of the computing device 1900 based on signals generated by a constellation of GPS satellites, thereby facilitating common location services such as navigation.

The computing device 1900 can use motion detectors 1918 such as accelerometers, and gyroscopes to determine an orientation of the device in three-dimensions (3D). The orientation sensor 1919 can use a MEMS-based magnetometer such as described above and shown in FIG. 22 for determining a direction of the computing device. The motion detectors 1918 and the orientation sensor 1919 can be used in combination according to method 1800 of FIG. 18 to perform navigation functions that overcome dead reckoning. The controller 1906 can utilize computing technologies such as a state machine, a microprocessor, a digital signal processor (DSP), and/or a video processor with associated storage memory such as Flash, ROM, RAM, SRAM, DRAM or other storage technologies.

Several of the aforementioned technologies of the computing device 1900 may require a reference clock signal such as one generated by the mechanical resonating structure described herein for proper operation. Fractional-N synthesizers can be used to adjust the resonating frequency generated by a mechanical resonating structure to a desired frequency used by components of the computing device 1900. Additionally, clock distribution technology can be used to distribute clock signals to such components. For example, the transceiver 1902 may require reference oscillators for mixers of the receiver and transmitter sections. The location receiver 1916 may also require a precision oscillator to generate coordinate measurements from a constellation of satellite signals. The mechanical resonating structure can also be used to support the functions of the motion detectors 1918. Charging system technologies of the power supply 1914 can also require a timing reference.

Figure 20:
FIG. 20 illustrates embodiments utilizing the computing device of FIG. 15.

FIG. 20 illustrates some embodiments in which the computing device 1900 (utilizing one or more mechanical resonating structures) in whole or in part is integrated into base stations, satellite systems, WiFi routers, cell phones, watches, clocks, laptop computers, desktop computers, tablets, gaming consoles with 3D gaming accessories, and automobiles. It should be apparent from these illustrations that there may be numerous applications for the mechanical resonating structure which cannot all be described in the present disclosure for practical reasons. Nonetheless, such applications are contemplated by the present disclosure and considered within the scope of the claims described below.

It should also be understood that the various embodiments shown in the Figures are illustrative representations, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present disclosure, but not necessarily in all embodiments. Consequently, appearances of the phrases "in one embodiment," "in an embodiment," or "in some embodiments" in various places throughout the Specification are not necessarily referring to the same embodiment. Furthermore, the particular features, structures, materials, or characteristics can be combined in any suitable manner in one or more embodiments.

Unless the context clearly requires otherwise, throughout the disclosure, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list; all of the items in the list; and any combination of the items in the list.

Having thus described several embodiments of this disclosure, it is to be appreciated that various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. An apparatus, comprising:
   a magnetic core;
   a mechanical resonator comprising an active layer on a compensating structure; and
   an induction coil formed on the mechanical resonator and arranged to produce an electrical signal having an operating frequency proportional to a mechanical resonating frequency of the mechanical resonator and proportional to a change in a magnetic flux in the magnetic core resulting from a change in orientation of the apparatus.

2. The apparatus of claim 1, wherein the active layer is a piezoelectric material.

3. The apparatus of claim 1, wherein the compensating structure comprises one or more materials having an adaptive stiffness that reduces a variance in the mechanical resonating frequency of the mechanical resonator.

4. The apparatus of claim 1, wherein the compensating structure comprises:
   a first layer having a stiffness that adapts to a change in temperature over a first temperature range;
   a third layer having a stiffness that adapts to a change in temperature over a second temperature range; and
   a second layer between the first layer and the third layer.

5. The apparatus of claim 4, wherein the first and third layers are formed of silicon dioxide, and wherein the second layer is formed of silicon.

6. The apparatus of claim 1, wherein the magnetic core is a ferromagnetic material.

7. The apparatus of claim 1, wherein the induction coil comprises at least one conductive loop extending around the magnetic core and integrated on the mechanical resonator.

8. An apparatus, comprising:
   a magnetic core;
   a mechanical resonator having an annular geometry with an opening, wherein the magnetic core is at least partially located within the opening, and wherein the mechanical resonator is coupled to two or more anchors; and
   an induction coil formed on the mechanical resonator, comprising a conductor having at least one loop, and arranged to produce an electrical signal having an operating frequency proportional to a mechanical resonating frequency of the mechanical resonator and proportional to a change in a magnetic flux in the magnetic core resulting from a change in orientation of the apparatus.

9. The apparatus of claim 8, wherein the magnetic core is a first magnetic core, the mechanical resonator is a first mechanical resonator, and the induction coil is a first induction coil, the apparatus further comprising a second magnetic core, a second mechanical resonator, and a second induction coil arranged to produce a signal representing a two-dimensional or greater dimensional magnetic field vector.

10. A navigation system, comprising:
    a global positioning system receiver;
    a gyroscope;
    an accelerometer;
    an orientation sensor, comprising:
       a mechanical resonator; and
       an induction coil formed on the mechanical resonator and arranged to produce an electrical signal having an operating frequency proportional to a mechanical resonating frequency of the mechanical resonator and proportional to a change in a magnetic flux resulting from a change in orientation of the orientation sensor;
    a memory to store instructions; and
    a controller coupled to the memory, the global positioning system receiver, the gyroscope, the accelerometer and the orientation sensor, wherein responsive to executing the instructions, the controller performs operations comprising:
       detecting a failure of the global positioning system receiver to provide a reliable location coordinate; and
       determining a position and orientation of the navigation system according to a last known location coordinate supplied by the global positioning system receiver and position information obtained from at least one of the gyroscope, the accelerometer, the orientation sensor, or a combination thereof.

11. The navigation system of claim 10, wherein the orientation sensor further comprises a magnetic core, wherein the operating frequency of the electrical signal is proportional to the mechanical resonating frequency of the mechanical resonator and proportional to the change in the magnetic flux in the magnetic core resulting from the change in orientation of the orientation sensor.

12. The navigation system of claim 10, wherein the gyroscope comprises a three-axis gyroscope, and wherein the accelerometer comprises a three-axis accelerometer.

13. The navigation system of claim 10, wherein the global positioning system receiver comprises a second mechanical resonator.

14. The navigation system of claim 10, wherein the gyroscope comprises a second mechanical resonator.

15. The navigation system of claim 10, wherein the accelerometer comprises a second mechanical resonator.

16. The navigation system of claim 10, wherein the mechanical resonator comprises an active layer on a compensating structure, and wherein the active layer is a piezoelectric material, and wherein the compensating structure comprises one or more materials having a stiffness that adapts to a change in temperature for reducing a variance in a mechanical resonating frequency of the mechanical resonator.

17. The navigation system of claim 10, wherein two or more of the global positioning system receiver, the gyroscope, the accelerometer, and the orientation sensor are formed on the same substrate to form a first component.

18. The navigation system of claim 10, comprising at least one more instance of the orientation sensor resulting in a plurality of orientation sensors, wherein the controller, responsive to executing the instructions, further performs operations comprising:
　　detecting a plurality of signals from the plurality of orientation sensors; and
　　determining from the plurality of signals a two-dimensional or greater dimensional magnetic field vector for determining the orientation of the navigation system.

19. The navigation system of claim 10, comprising a timing reference supplied to the global positioning system receiver, wherein the timing reference is received from a second mechanical resonator.

20. A method, comprising:
　　producing an electrical signal from an apparatus comprising an induction coil formed on a mechanical resonator, the mechanical resonator comprising an active layer on a compensating structure, wherein the electrical signal has an operating frequency proportional to a mechanical resonating frequency of the mechanical resonator and proportional to a change in a magnetic flux resulting from a change in orientation in the apparatus;
　　detecting with a detection circuit a change in the electrical signal resulting from a change in the magnetic flux caused by the change in orientation in the apparatus; and
　　determining a direction of the apparatus according to the change in the electrical signal.

21. The method of claim 20, wherein the active layer is a piezoelectric material, and wherein the compensating structure comprises one or more materials having a stiffness that adapts to a change in temperature for reducing a variance in the mechanical resonating frequency of the mechanical resonator.

22. A method, comprising:
　　producing an electrical signal from an apparatus comprising an induction coil formed on a mechanical resonator, wherein the electrical signal has an operating frequency proportional to a mechanical resonating frequency of the mechanical resonator and proportional to a change in a magnetic flux resulting from a change in orientation in the apparatus;
　　detecting with a detection circuit a change in the electrical signal resulting from a change in the magnetic flux caused by the change in orientation in the apparatus;
　　determining a direction of the apparatus according to the change in the electrical signal; and
　　supplying the direction to a navigation system, wherein the direction enables the navigation system to determine a position and orientation of the navigation system based on a last known reliable location coordinate of a global positioning system receiver.

23. The method of claim 20, comprising supplying the direction to one of a medical device, a geological measurement device, or planetary measurement device.

24. The method of claim 20, wherein the apparatus comprises a magnetic core, and wherein the operating frequency of the electrical signal is proportional to the mechanical resonating frequency of the mechanical resonator and proportional to the change in the magnetic flux in the magnetic core resulting from a change in orientation of the apparatus.

* * * * *